(12) United States Patent
Lai

(10) Patent No.: US 8,885,401 B2
(45) Date of Patent: *Nov. 11, 2014

(54) LOAD AND SHORT CURRENT MEASUREMENT BY CURRENT SUMMATION TECHNIQUE

(71) Applicant: Sandisk 3D, LLC, Milpitas, CA (US)

(72) Inventor: Vincent Lai, Gilroy, CA (US)

(73) Assignee: Sandisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/254,880

(22) Filed: Apr. 16, 2014

(65) Prior Publication Data

US 2014/0226417 A1    Aug. 14, 2014

Related U.S. Application Data

(63) Continuation of application No. 13/754,801, filed on Jan. 30, 2013.

(51) Int. Cl.
| | | |
|---|---|---|
| *G11C 11/00* | (2006.01) | |
| *G11C 13/00* | (2006.01) | |
| *G11C 7/00* | (2006.01) | |
| *G11C 5/14* | (2006.01) | |

(52) U.S. Cl.
CPC ............ *G11C 5/147* (2013.01); *G11C 13/0004* (2013.01); *G11C 7/00* (2013.01)
USPC .................. 365/163; 365/185.02; 365/185.18; 365/185.28

(58) Field of Classification Search
CPC ......... G11C 13/004; G11C 7/00; G11C 5/147
USPC .................. 365/163, 185.02, 185.18, 185.28
See application file for complete search history.

(56) References Cited

U.S. PATENT DOCUMENTS

| | | | | |
|---|---|---|---|---|
| 6,898,122 | B2 * | 5/2005 | Pekny ...................... | 365/185.18 |
| 7,079,413 | B2 * | 7/2006 | Tsukamoto et al. .......... | 365/154 |
| 7,301,797 | B2 * | 11/2007 | Kimura ......................... | 365/154 |
| 7,319,609 | B2 * | 1/2008 | Chih ........................ | 365/185.02 |
| 7,333,357 | B2 * | 2/2008 | Houston ...................... | 365/154 |
| 7,468,919 | B2 * | 12/2008 | Sekar et al. .............. | 365/185.27 |
| 7,542,360 | B2 * | 6/2009 | Rashed et al. ................ | 365/201 |
| 8,705,300 | B1 * | 4/2014 | Xu et al. ...................... | 365/201 |
| 2003/0016086 | A1 | 1/2003 | Yang | |

OTHER PUBLICATIONS

U.S. Appl. No. 13/754,801, filed Jan. 2013, Lai, Vincent.*

(Continued)

*Primary Examiner* — Pho M Luu
(74) *Attorney, Agent, or Firm* — Vierra Magen Marcus LLP

(57) ABSTRACT

Methods for monitoring one or more load currents corresponding with one or more voltage regulators used during operation of a semiconductor memory are described. The one or more load currents may be due to the biasing of memory cells within a memory array or due to the presence of shorts between lines in the memory array. A plurality of load currents corresponding with a plurality of voltage regulators may be monitored in real-time before and during biasing of one or more memory arrays. The plurality of load currents may be monitored using a configurable load current monitoring circuit that uses a current summation technique. The ability to monitor the plurality of load currents before performing a programming operation on a memory array allows for remapping of defective portions of the memory array and modification of programming bandwidth prior to the programming operation.

28 Claims, 18 Drawing Sheets

(56) References Cited

OTHER PUBLICATIONS

Lei, "A folded cascode OTA using current-mode gain-boost amplifier," Beijing Institute of Technology, 2010 IEEE, pp. 92-95.
Huang, "A Method to Effectively Decrease the Settling Time of Gain-Boost OTA," Fudan University, Shanghai, China, 2005 IEEE, pp. 459-462.
Flandre, "Improved Synthesis of Gain-Boosted Regulated-Cascode CMOS Stages Using Symbolic Analysis and gm/ID Methodology," IEEE Journal of Solid-State Circuits, vol. 32, No. 7, Jul. 1997, pp. 1006-1012.
Zao, "The design and optimization of gain-boosted OTA for high speed and high accuracy sample and hold amplifier," Xi'an Jiaotong University, 2007 IEEE, pp. 461-464.
Notice of Allowance dated Jun. 9, 2014, U.S. Appl. No. 13/754,801.

* cited by examiner

LOAD AND SHORT CURRENT MEASUREMENT BY CURRENT SUMMATION TECHNIQUE

CLAIM OF PRIORITY

The present application is a continuation of U.S. patent application Ser. No. 13/754,801, entitled "Load and Short Current Measurement by Current Summation Technique," filed Jan. 30, 2013, which is herein incorporated by reference in its entirety.

BACKGROUND

Semiconductor memory is widely used in various electronic devices such as cellular telephones, digital cameras, personal digital assistants, mobile computing devices, and non-mobile computing devices. A non-volatile memory device (e.g., a flash memory device) allows information to be stored and retained even when the non-volatile memory device is not connected to a source of power (e.g., a battery). Non-volatile memory devices typically include two-dimensional arrays of non-volatile memory cells. The memory cells within a two-dimensional array form a single layer of memory cells and may be selected via control lines in the X and Y directions. Non-volatile memory devices may also include monolithic three-dimensional memory arrays in which multiple layers of memory cells are formed above a single substrate without any intervening substrates. In recent years, non-volatile memory devices have been scaled in order to reduce cost per bit. However, as process geometries shrink, many design and process challenges are presented. These challenges include increased variability in memory cell leakage current over process, voltage, and temperature.

DETAILED DESCRIPTION

Technology is described for monitoring one or more load currents corresponding with one or more voltage regulators used during operation of a semiconductor memory. The one or more load currents may be due to the biasing of memory cells within a memory array or due to the presence of shorts between lines in the memory array (e.g., word line to bit line shorts or word line to word line shorts). In some embodiments, a plurality of load currents corresponding with a plurality of voltage regulators may be monitored in real-time before and during biasing of one or more memory arrays (e.g., prior to programming or during programming of the one or more memory arrays). The plurality of load currents may be monitored via a configurable load current monitoring circuit that uses a current summation technique. The current summation technique allows for the measurement of load currents over a wide range (e.g., between 20 mA and 200 nA). The ability to monitor the plurality of load currents before performing a programming operation on a memory array allows for remapping of defective portions of the memory array and modification of programming bandwidth (e.g., modification to the number of memory cells programmed simultaneously during the programming operation) prior to the programming operation.

In some cases, a semiconductor memory array may include a cross-point memory array. A cross-point memory array comprises a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a phase change material. Each memory cell in a cross-point memory array may be placed in series with a steering element, such as a diode, in order to reduce leakage currents associated with unselected memory cells. One issue involving the biasing of memory cells in a cross-point memory array is that memory cell characteristics (e.g., leakage current) may vary greatly over biasing voltage and temperature. Moreover, the variations in memory cell characteristics may vary die-to-die (e.g., due to manufacturing variations between dies fabricated on the same wafer, on different wafers, or in different lots) or plane-to-plane on the same die. As these variations in memory cell characteristics may impact memory performance and reliability, there is a need to monitor memory cell characteristics during operation of a semiconductor memory array to compensate for variations associated with both selected memory cells and unselected memory cells in the semiconductor memory array.

Figure 1A:
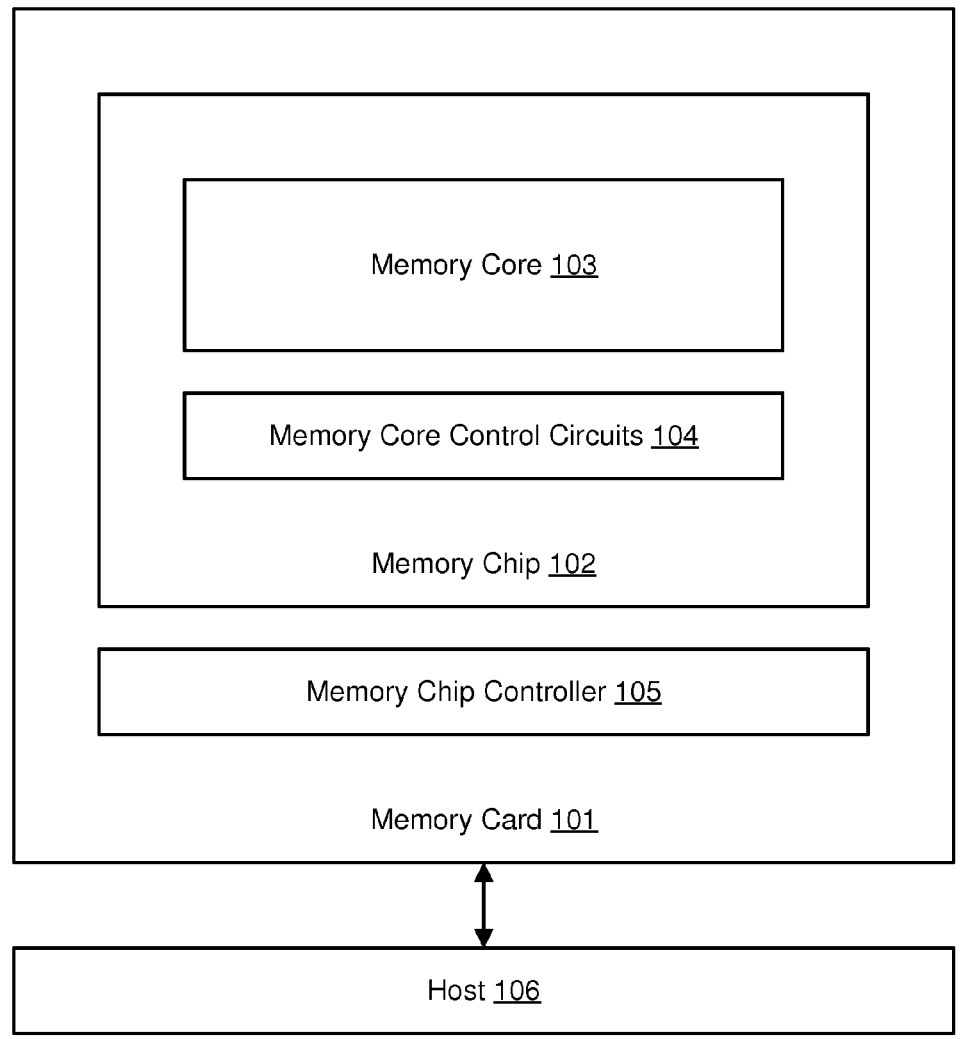
FIG. 1A depicts one embodiment of a memory system.

FIG. 1A depicts one embodiment of a memory system 100. Memory system 100 includes a host 106 (e.g., a personal computer or mobile computing device) and a memory card 101. The memory card 101 includes a memory chip controller 105 and a memory chip 102. The memory chip controller 105 may include one or more state machines, page registers, SRAM, or other control logic for controlling the operation of memory chip 102. The one or more state machines, page registers, SRAM, and/or other control logic for controlling the operation of the memory chip may be referred to as managing or control circuits for facilitating one or more memory array operations including erasing, programming, or reading operations. The memory chip controller may receive data and commands from host 106 and provides memory chip data to host 106.

In one embodiment, the memory chip controller 105 and memory chip 102 may be arranged on a single integrated circuit. In other embodiments, memory chip controller 105 and memory chip 102 may be arranged on different integrated circuits. The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 and memory core 103 are arranged on different integrated circuits.

Referring to FIG. 1A, a memory card operation may be initiated when host 106 sends instructions to memory chip controller 105 indicating that it would like to read data from memory card 101 or write data to memory card 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

Figure 1B:
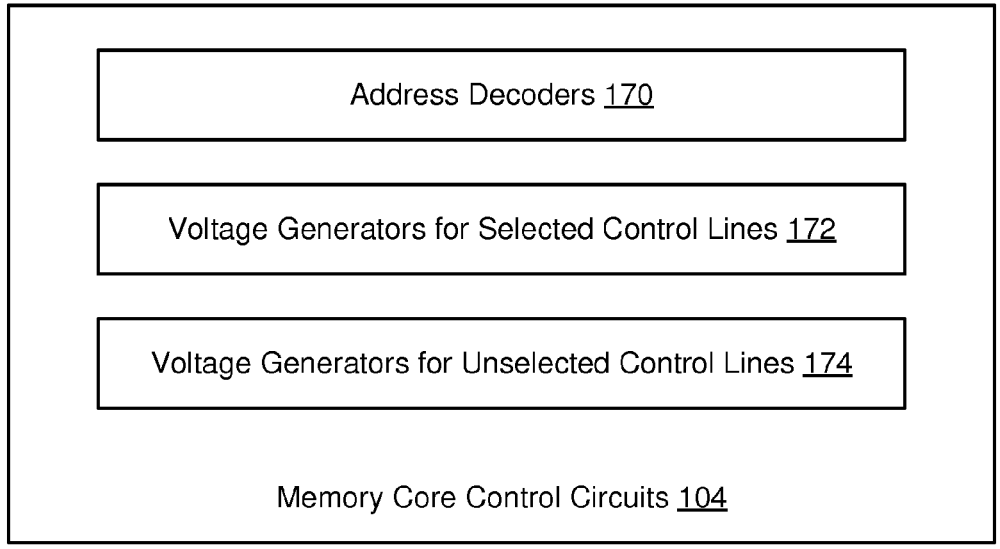
FIG. 1B depicts one embodiment of memory core control circuits.

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
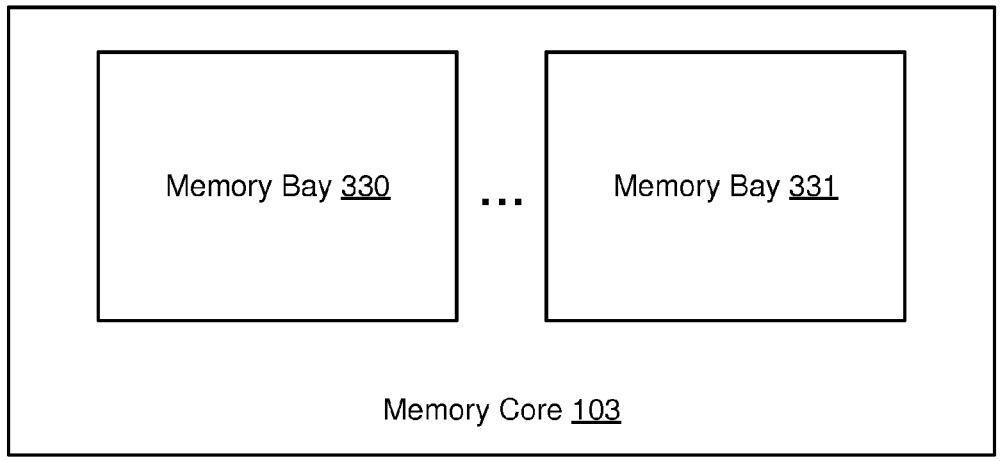
FIG. 1C depicts one embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
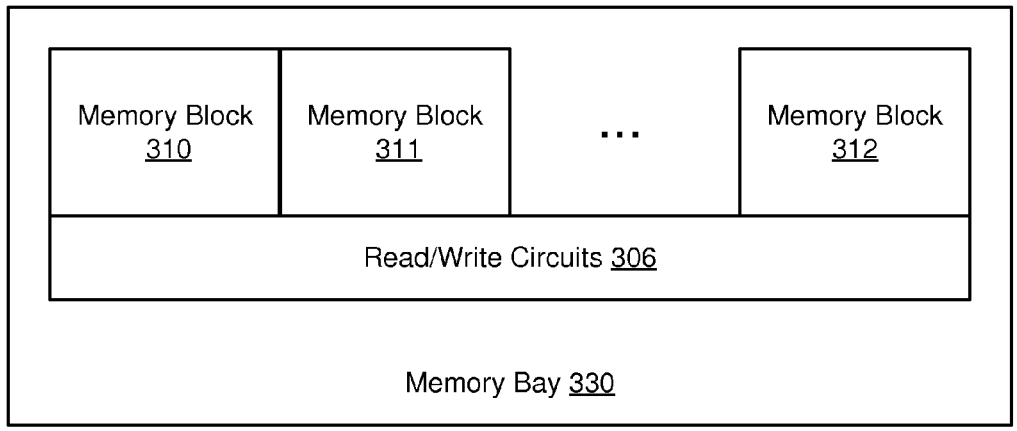
FIG. 1D depicts one embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block should be electrically coupled to read/write circuits 306 at a particular time to avoid signal conflicts.

Figure 1E:
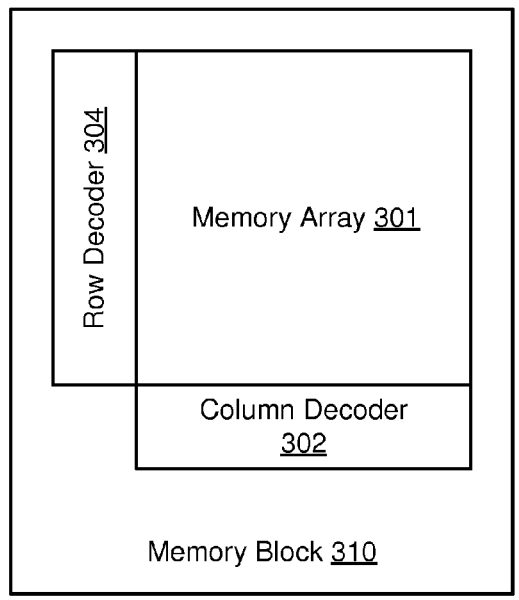
FIG. 1E depicts one embodiment of a memory block.

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells (i.e., memory array 310 may comprise a two-dimensional memory array or a three-dimensional memory array). The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16 M memory cells.

Figure 1F:
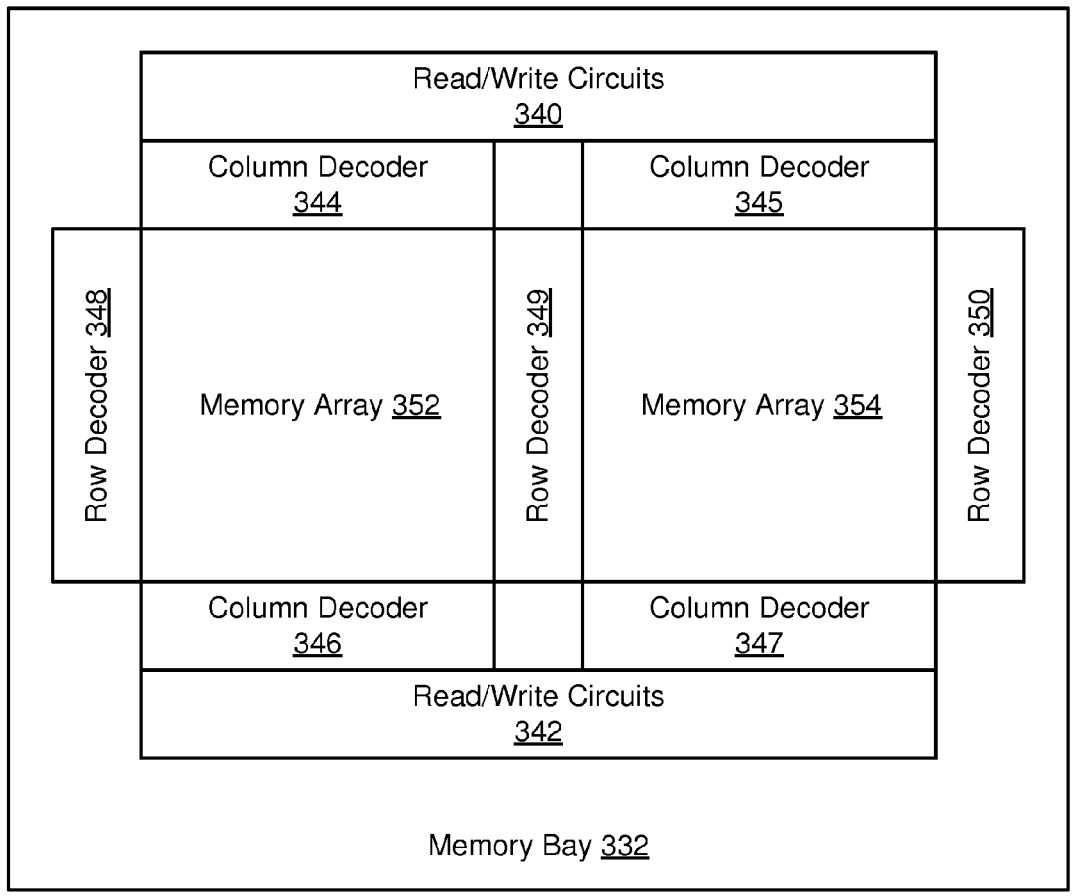
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split allows for a more efficient layout of the memory bay.

Figure 2A:
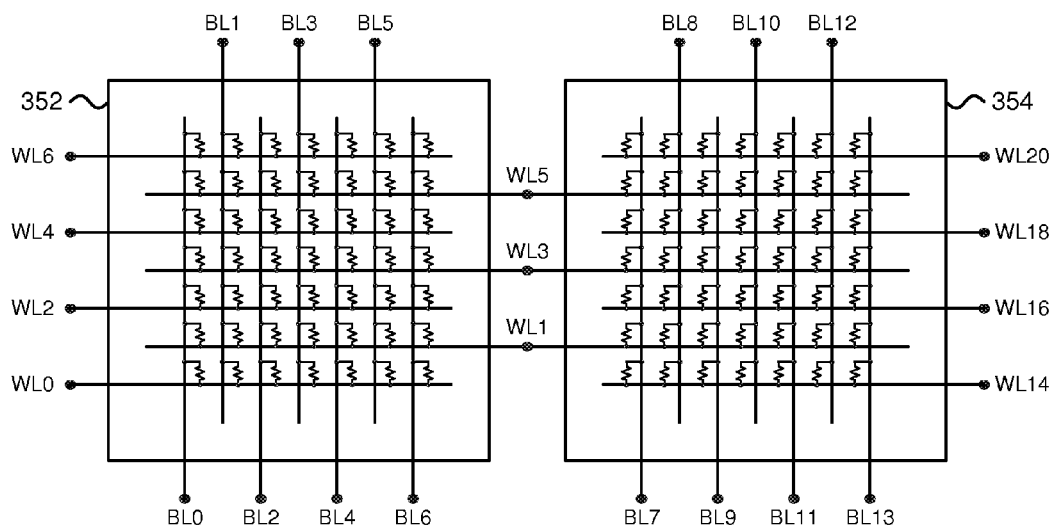
FIG. 2A depicts one embodiment of a schematic diagram corresponding with the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical to the supporting substrate (i.e., the vertical plane is perpendicular to the supporting substrate).

Figure 2B:
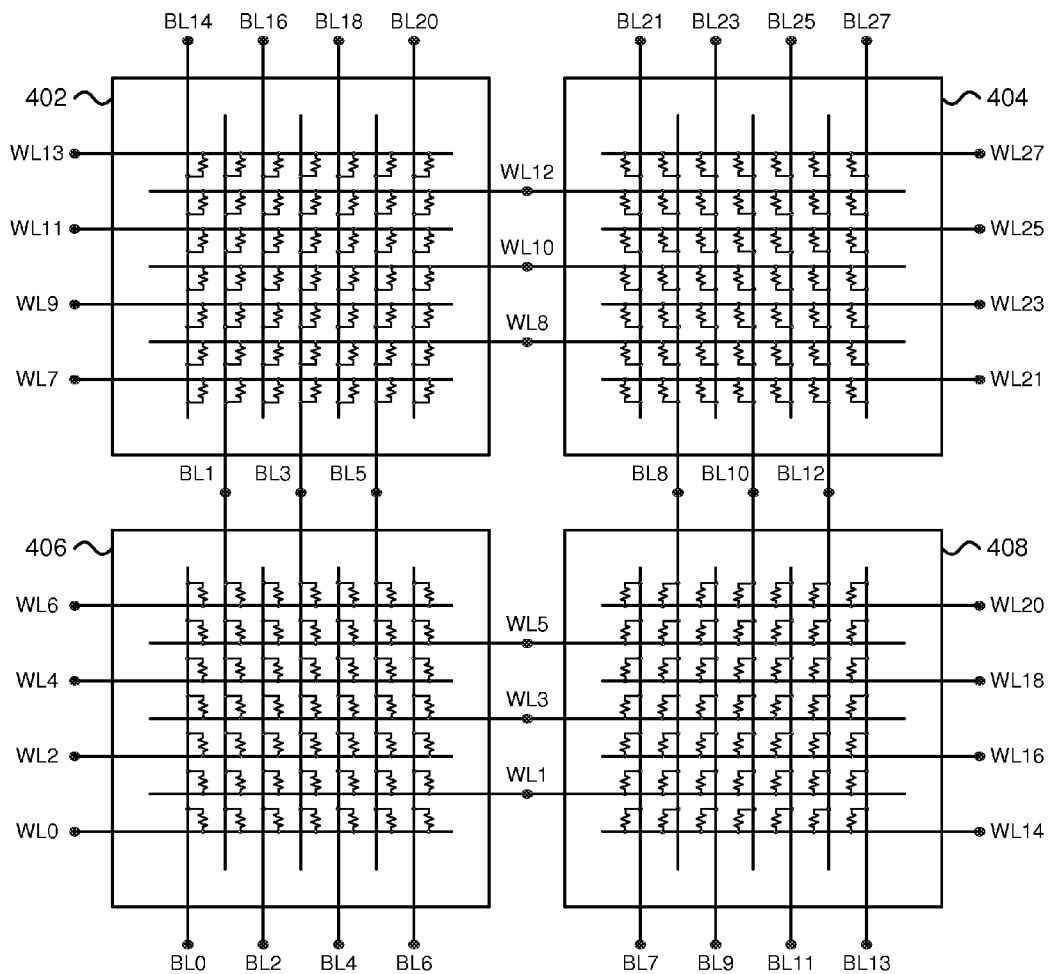
FIG. 2B depicts one embodiment of a schematic diagram corresponding with a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
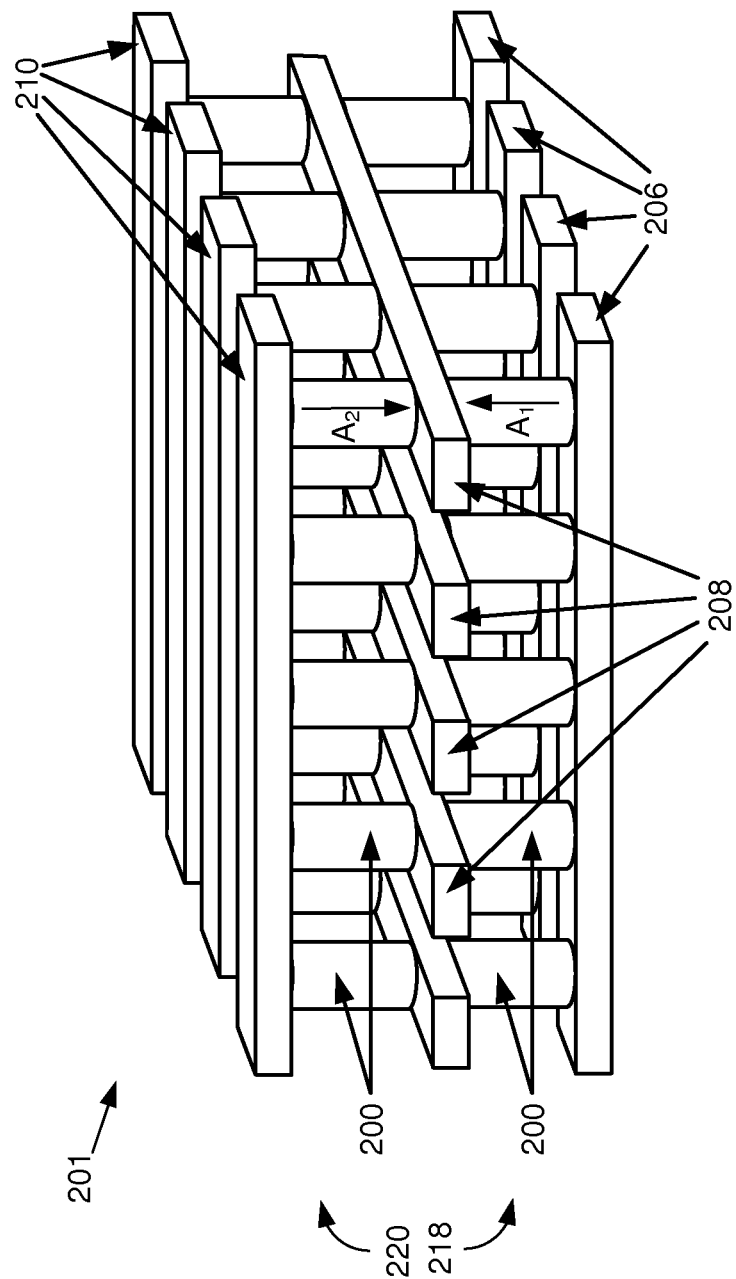
FIG. 3A depicts one embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode from a memory cell may reduce the process complexity and costs associated with manufacturing a memory array.

In one embodiment, the memory cells 200 of FIG. 3A include re-writable non-volatile memory cells. In one example, U.S. Patent Application Publication No. 2006/0250836, which is herein incorporated by reference in its entirety, describes a rewriteable non-volatile memory cell that includes a diode coupled in series with a reversible resistance-switching element. A reversible resistance-switching element includes reversible resistivity-switching material having a resistivity that may be reversibly switched between two or more states. In one embodiment, the reversible resistance-switching material may include a metal oxide. The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 3A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a read operation, the data stored in one of the plurality of memory cells 200 may be read by biasing one of the word lines (i.e., the selected word line) to the selected word line voltage in read mode (e.g., 0.4V). A read circuit is then used to bias a selected bit line connected to the selected memory cell to the selected bit line voltage in read mode (e.g., 0V). In some cases, in order to avoid sensing leakage current from the many unselected word lines to the selected bit line, the unselected word lines may be biased to the same voltage as the selected bit lines (e.g., 0V). To avoid leakage current from the selected word line to the unselected bit lines, the unselected bit lines may be biased to the same voltage as the selected word line (e.g., 0.4V); however, biasing the unselected word lines to the same voltage as the selected bit lines and biasing the unselected bit lines to the same voltage as the selected word line will place a large voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. Leakage current may be subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation is similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "0" and the low-resistivity state may be associated with binary data "1." In other embodiments, SETTING and RESETTING operations and/or the data encoding can be reversed. In some embodiments, the first time a resistance-switching element is SET requires a higher than normal voltage and is referred to as a FORMING operation.

Referring to FIG. 3A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
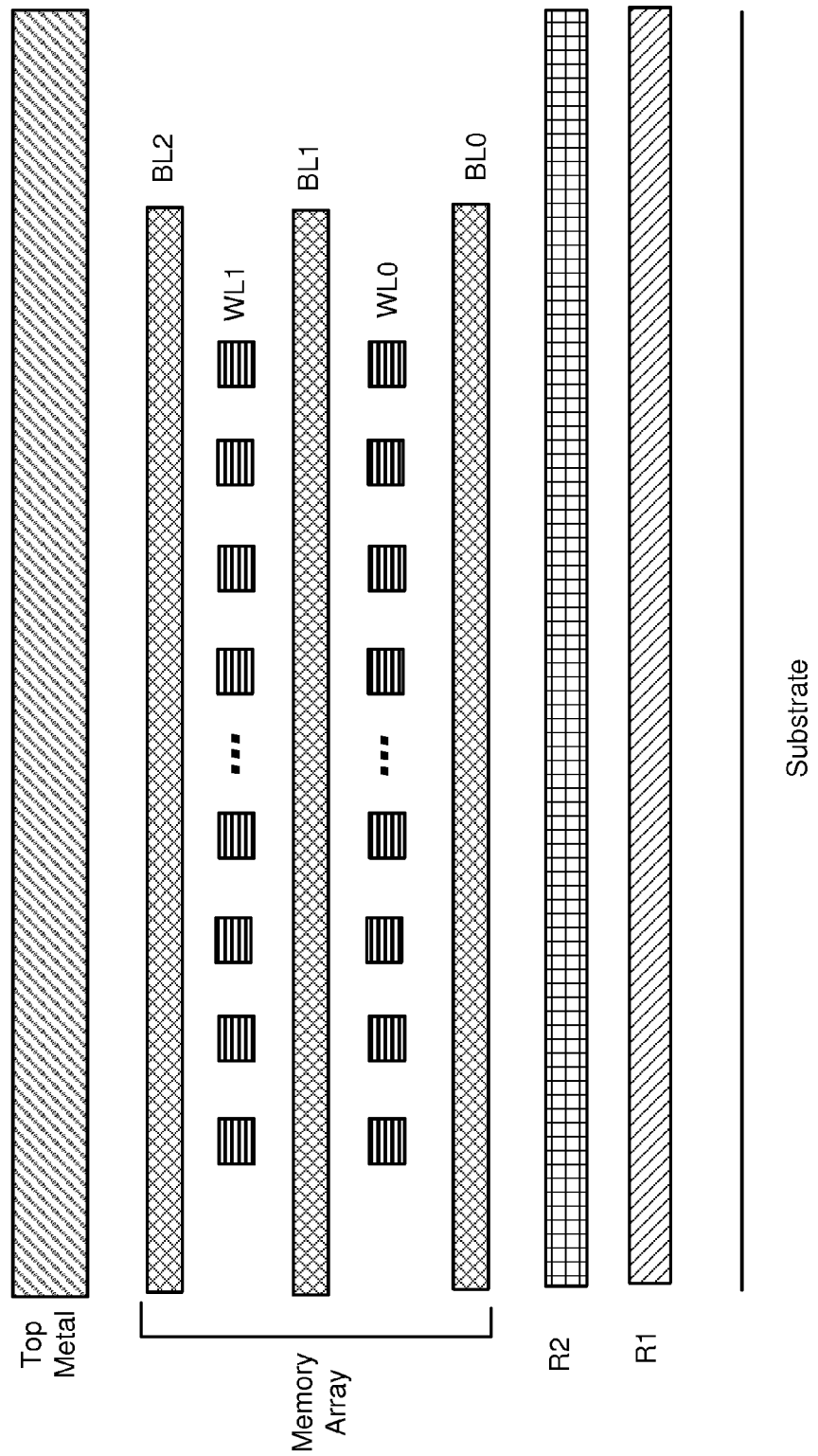
FIG. 3B depicts a subset of the memory array and routing layers of one embodiment of a three-dimensional memory array.

FIG. 3B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit such as the Top Metal layer. In one example, the Top Metal layer is formed of copper or aluminum (about 0.05 ohms/square), which may provide a smaller resistance per unit area than layers R1 and R2. Metals layers R1 and R2 may not be implemented using the same materials as those used for the Top Metal layers because the metal used for R1 and R2 must be able to withstand the processing steps for fabricating the Memory Array layers on top of R1 and R2.

Figure 4:
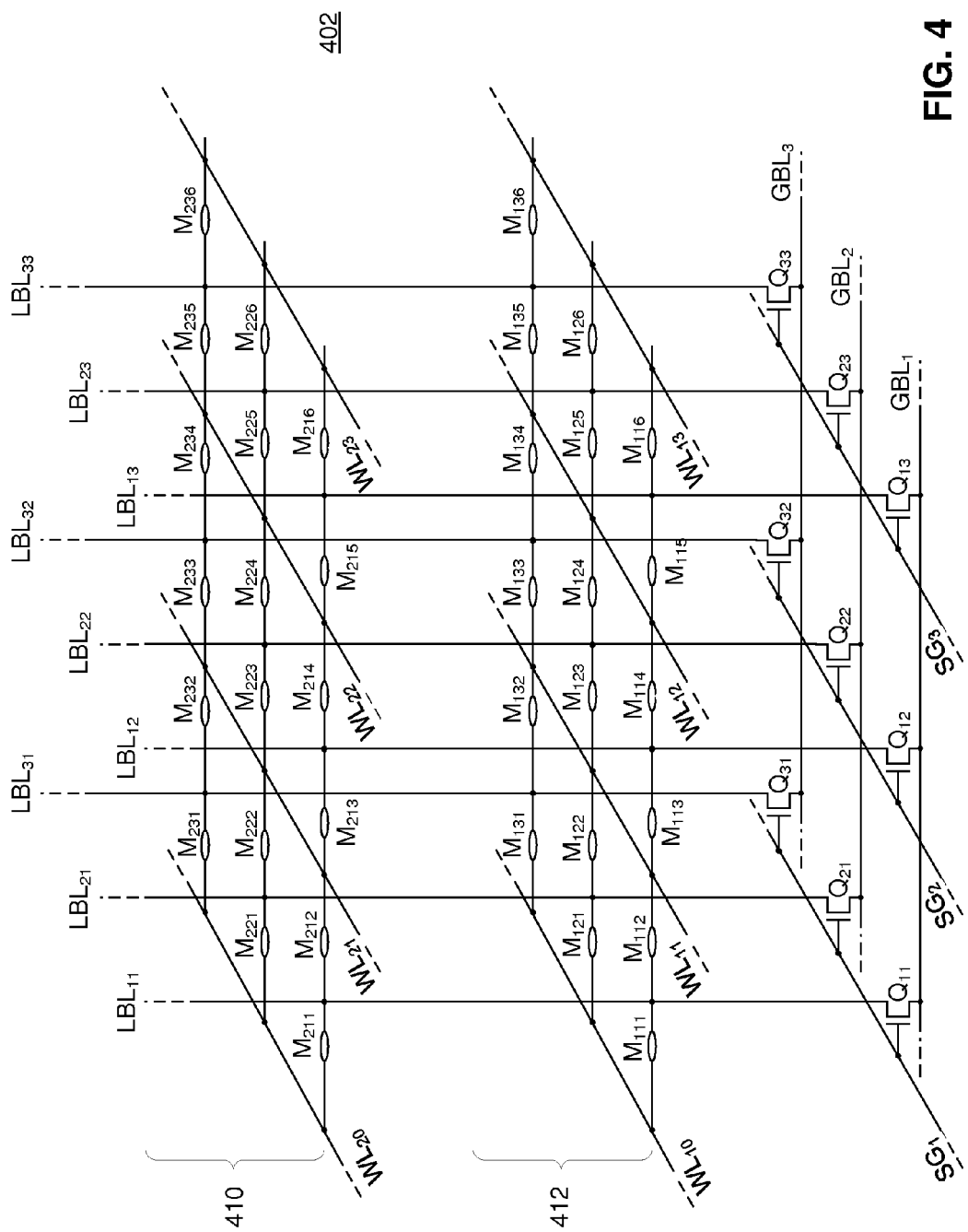
FIG. 4 depicts one embodiment of a portion of a monolithic three-dimensional memory array.

FIG. 4 depicts one embodiment of a portion of a monolithic three-dimensional memory array 402 that includes a first memory level 412 positioned below a second memory level 410. Memory array 402 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{13}$-$Q_{32}$ are used to selectively connect the local bit lines $LBL_{31}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 402, includes a greater number of memory cells along the word lines as compared with the number of memory cells along the bit lines. For example, the number memory cells along each bit line may be 16, while the number of memory cells along each word line may be 2048. More information regarding the structure and operation of vertical bit line memory arrays can be found in U.S. Provisional Application 61/423,007, "Non-Volatile Memory Having 3D Array of Read/Write Elements With Vertical Bit Lines and Laterally Aligned Active Elements and Methods Thereof" and U.S. patent application Ser. No. 13/323,703, "Three Dimensional Non-Volatile Storage with Three Device Driver for Row Select," both of which are herein incorporated by reference in their entirety.

Figure 5:
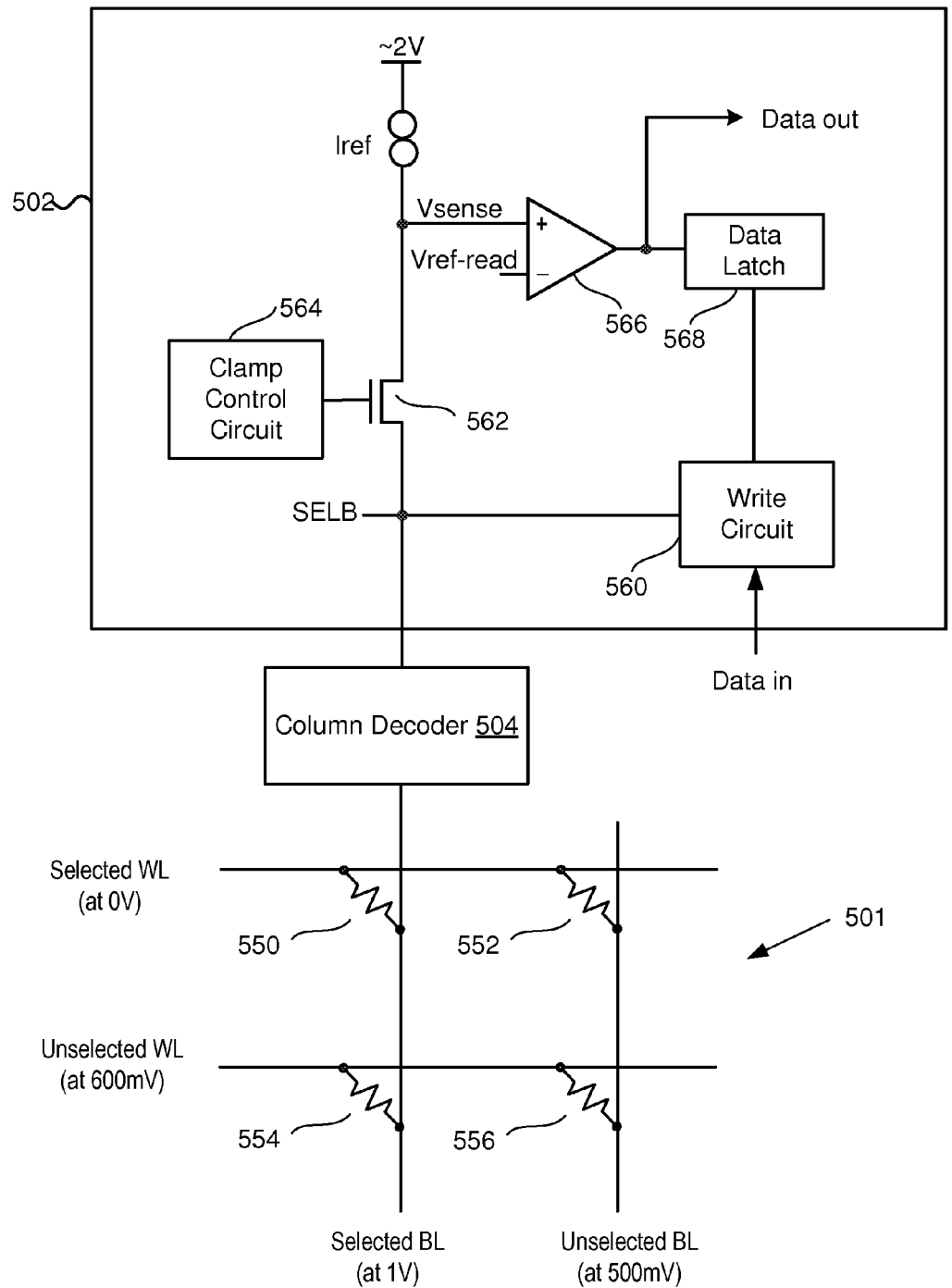
FIG. 5 depicts one embodiment of a read/write circuit along with a portion of a memory array.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 3A. In another embodiment, the portion of a memory array 501 may comprise a memory array with bit lines arranged in a vertical direction that is perpendicular to the substrate, such as memory array 402 in FIG. 4. As depicted, the selected bit line is biased to 1V, the unselected word line is biased to 0.6V, the selected word line is biased to 0V, and the unselected bit line is biased to 0.5V.

In some embodiments, the memory array biasing scheme of FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 is electrically coupled to the selected bit line via column decoder 504. In one embodiment, column decoder 504 may correspond with column decoder 302 depicted in FIG. 1E. Transistor 562 couples node SELB to the Vsense node. Clamp control circuit 564 controls transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the data in terminal, and data latch 568.

During a read operation, read/write circuit 502 biases the selected bit line to the selected bit line voltage in read mode. Prior to sensing data, read/write circuit 502 will precharge the Vsense node to 2V. When sensing data, read/write circuit 502 attempts to regulate the SELB node to 1V via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 will latch the output of sense amplifier 566 after a time period of sensing the current through the selected memory cell (e.g., 400 ns).

In one embodiment, during a write operation, if the data in terminal requests a data "0" to be written to a selected memory cell, then read/write circuit 502 biases SELB to the selected bit line voltage in write mode (e.g., 1.2V for a SET operation) via write circuit 560. The duration of programming the memory cell can be a fixed time period (e.g., using a fixed-width programming pulse) or variable (e.g., using a write circuit 560 that senses whether a memory cell has been programmed while programming). More information regarding write circuits that can sense while programming data can be found in U.S. Pat. No. 6,574,145, "Memory Device and Method for Sensing While Programming a Non-Volatile Memory Cell," incorporated herein by reference in its entirety. If the data in terminal requests a data "1" to be written, then write circuit 560 may bias SELB to the unselected bit line voltage in write mode (e.g., 0V for a SET operation). The write circuit 560 may also bias SELB to a program inhibit voltage in write mode that is different from the unselected bit line voltage.

Figure 6A:
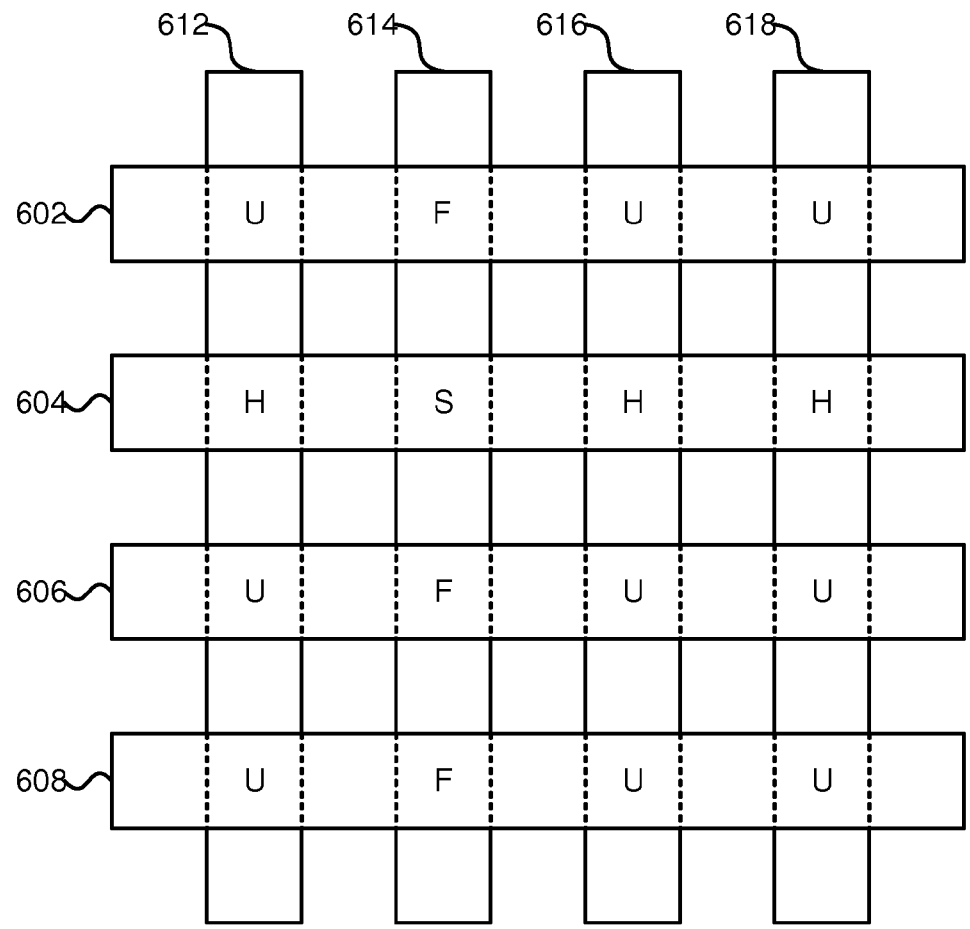
FIG. 6A depicts one embodiment of a cross-point memory array.

FIG. 6A depicts one embodiment of a cross-point memory array 610. The cross-point memory array 610 may correspond with memory array 201 in FIG. 3A or memory array 402 in FIG. 4. As depicted, cross-point memory array 610 includes word lines 602-608 and bit lines 612-618. Word line 604 comprises a selected word line and bit line 614 comprises a selected bit line. At the intersection of selected word line 604 and selected bit line 614 is a selected memory cell (an S cell). The voltage across the S cell is the difference between the selected word line voltage and the selected bit line voltage. Memory cells at the intersections of the selected word line 604 and the unselected bit lines 612, 616, and 618 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 614 and the unselected word lines 602, 606, and 608 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 602, 606, and 608 and the unselected bit lines 612, 616, and 618 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 602, may be associated with a particular page stored within the cross-point memory array 610.

Figure 6B:
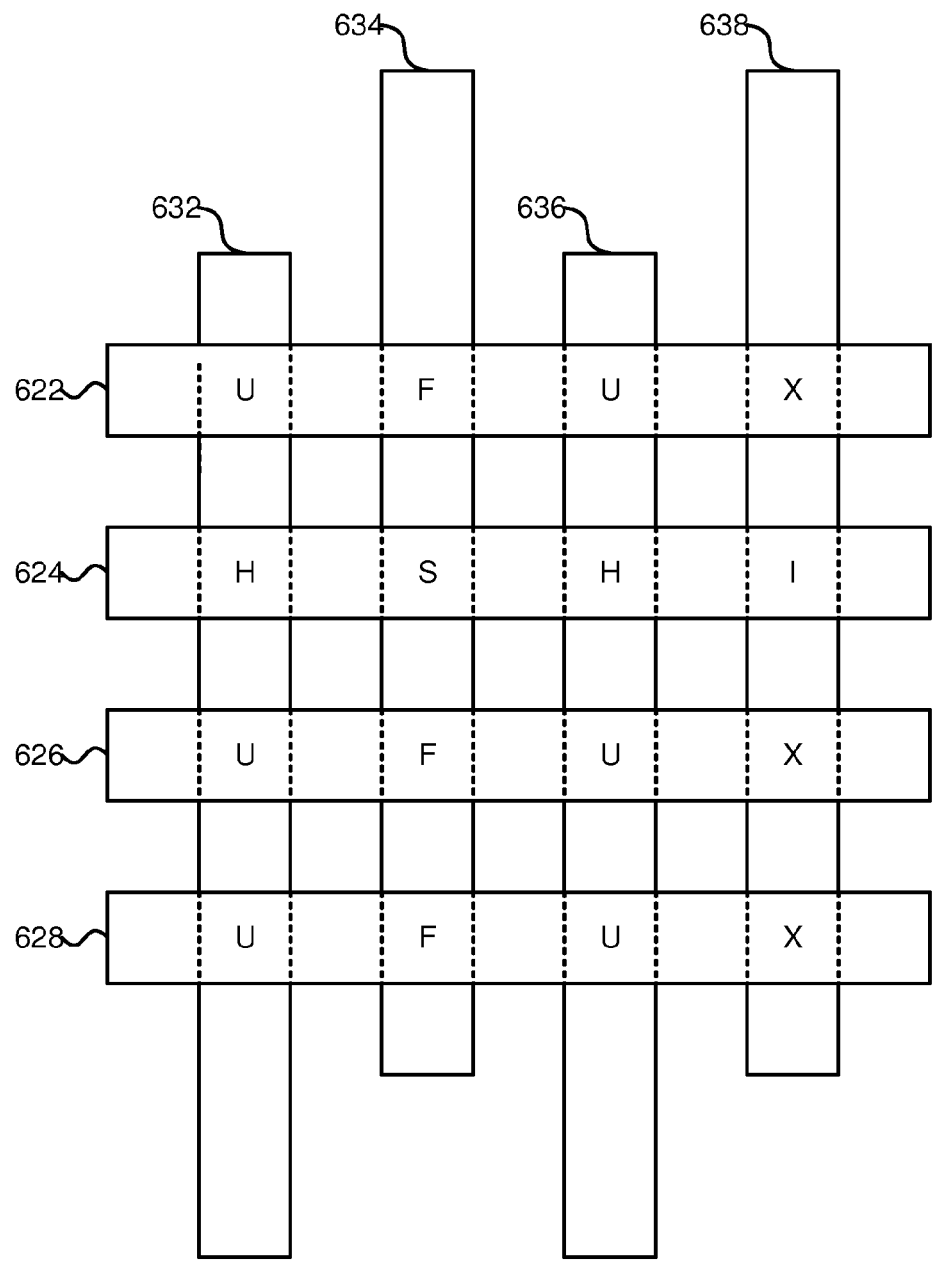
FIG. 6B depicts an alternative embodiment of a cross-point memory array.

FIG. 6B depicts an alternative embodiment of a cross-point memory array 620. The cross-point memory array 620 may correspond with memory array 201 in FIG. 3A or memory array 402 in FIG. 4. As depicted, cross-point memory array 620 includes word lines 622-628 and bit lines 632-638. Word line 624 comprises a selected word line and bit lines 634 and 638 comprise selected bit lines. Although both bit lines 634 and 638 are selected, the voltages applied to bit line 634 and bit line 638 may be different. For example, in the case that bit line 634 is associated with a first memory cell to be programmed (i.e., an S cell), then bit line 634 may be biased to a selected bit line voltage in order to program the first memory cell. In the case that bit line 638 is associated with a second memory cell that is not to be programmed (i.e., an I cell), then bit line 638 may be biased to a program inhibit voltage (i.e., to a bit line voltage that will prevent the second memory cell from being programmed).

At the intersection of selected word line 624 and selected bit line 638 is a program inhibited memory cell (an I cell). The voltage across the I cell is the difference between the selected word line voltage and the program inhibit voltage. Memory cells at the intersections of the selected bit line 638 and the unselected word lines 622, 626, and 628 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 638 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 622 may be associated with a first page and a second page. The first page may correspond with bit lines 632 and 636 and the second page may correspond with bit lines 634 and 638. In this case, the first page and the second page may correspond with interdigitated memory cells that share the same word line. When a memory array operation is being performed on the first page (e.g., a programming operation) and the selected word line 624 is biased to the selected word line voltage, one or more other pages also associated with the selected word line 624 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 620 may comprise resistive memory elements without isolating diodes. In another embodiment, a floating control line (e.g., bit line 636) comprises a portion of the memory array that may be undriven during an operation on memory cell S using a first selected control line (e.g., bit line 634). Selection devices connected to control line 636 may be turned off during the memory operation causing control line 636 to be floating. Since a portion of the memory cells connected to the control lines 634 and 636 are also connected to shared unselected second control lines 622, 626, and 628, the floating control lines will float to a voltage substantially the same as the voltage of the unselected second control lines. In one embodiment, the control lines 634 and 636 may comprise vertical bit lines in a three dimensional memory array comprising comb shaped word lines. More information regarding vertical bit line three dimensional memory arrays can be found in U.S. Provisional Application 61/526,764, "Optimized Architecture for Three Dimensional Non-Volatile Storage Device with Vertical Bit Lines" and U.S. patent application Ser. No. 13/323,573, "Three Dimensional Non-Volatile Storage with Multi Block Row Selection," both of which are herein incorporated by reference in their entirety.

Figure 7A:
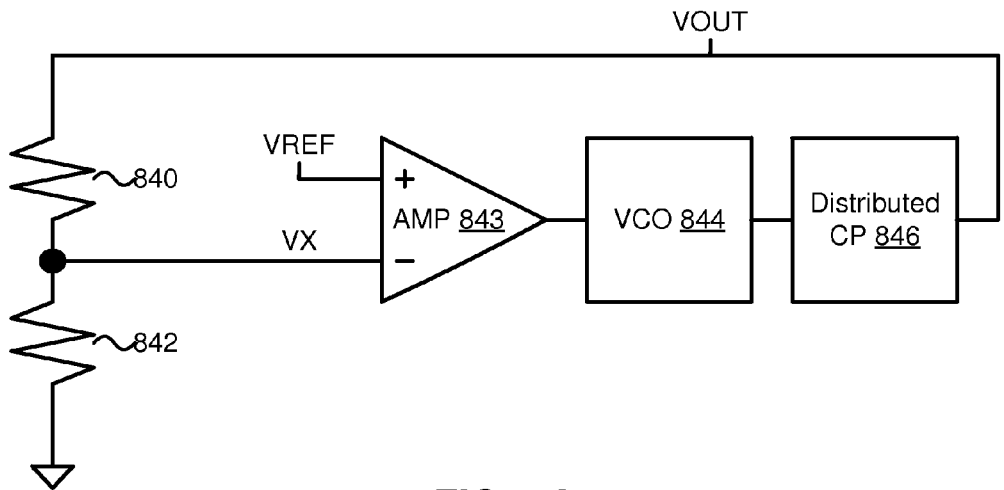
FIG. 7A depicts one embodiment of a voltage generator for generating voltages greater than a provided voltage supply.

FIG. 7A depicts one embodiment of a voltage generator for generating voltages greater than a provided voltage supply (e.g., a voltage that is provided by an external source or regulator located outside of a memory chip). The output voltage VOUT may be used as an input voltage to other on-chip voltage regulators in order to provide various voltage references to a memory array (e.g., selected word line voltages, unselected word line voltages, selected bit line voltages, and unselected bit line voltages). As depicted, VREF is used as an input to amplifier AMP 843. Due to closed-loop feedback, the voltage at node VX will be close to VREF and the voltage at node VOUT will be a multiplier higher than the voltage at node VX due to the voltage divider formed by resistors 840 and 842. The amplifier AMP 843 drives a voltage controlled oscillator VCO 844. VCO 844 drives one or more distributed charge pumps 846 that generate voltages higher than the supply voltage provided. Resistor and transistor trimming options may be used to modify the resulting output voltage VOUT. The reference voltage VREF may comprise a temperature insensitive reference voltage or a temperature dependent reference voltage. In one embodiment, VREF may be generated using a bandgap voltage reference.

Figure 7B:
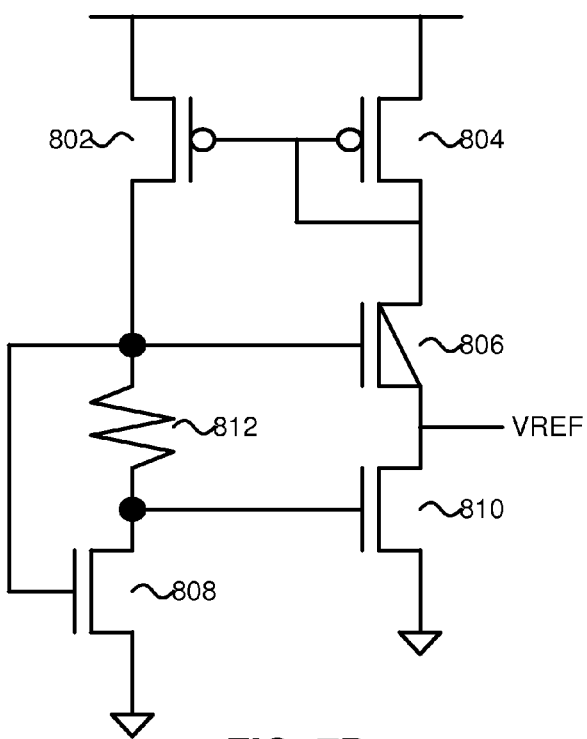
FIG. 7B depicts one embodiment of a voltage reference generator.

FIG. 7B depicts one embodiment of a voltage reference generator including transistors 802-810 and resistor 812 for generating a reference voltage, such as VREF in FIG. 7A. Transistors 808 and 810 comprise high VT nMOS transistors. Transistors 802 and 804 comprise pMOS transistors in a current mirror configuration. Transistor 806 comprises a low VT nMOS transistor. As depicted, the voltage reference generator generates and combines a proportional to absolute temperature (PTAT) voltage and a complementary to absolute temperature (CTAT) voltage based on a difference in transistor VTs between transistor 808 and transistor 806. By modifying the degree to which the PTAT voltage and the CTAT voltage are combined, a resulting output voltage may be created that is either PTAT, CTAT, or substantial independent of temperature. In one embodiment, the devices are sized such that VREF provides a temperature insensitive reference voltage. In another embodiment, the devices are sized such that VREF provides a CTAT voltage. Resistor and transistor trimming options may be used to modify the resulting output voltage and its slope over temperature. One benefit of using a voltage reference generator based on a difference in transistor VTs is that, unlike voltage references based on the base-emitter voltage of a bipolar junction transistor (e.g., a bandgap voltage reference), reference voltages may be generated over a wide range of temperatures using a sub-1V voltage supply. More information regarding voltage reference generation can be found in U.S. Pat. No. 7,999,529, "Methods and Apparatus for Generating Voltage References Using Transistor Threshold Differences," incorporated herein by reference in its entirety.

Figure 8A:
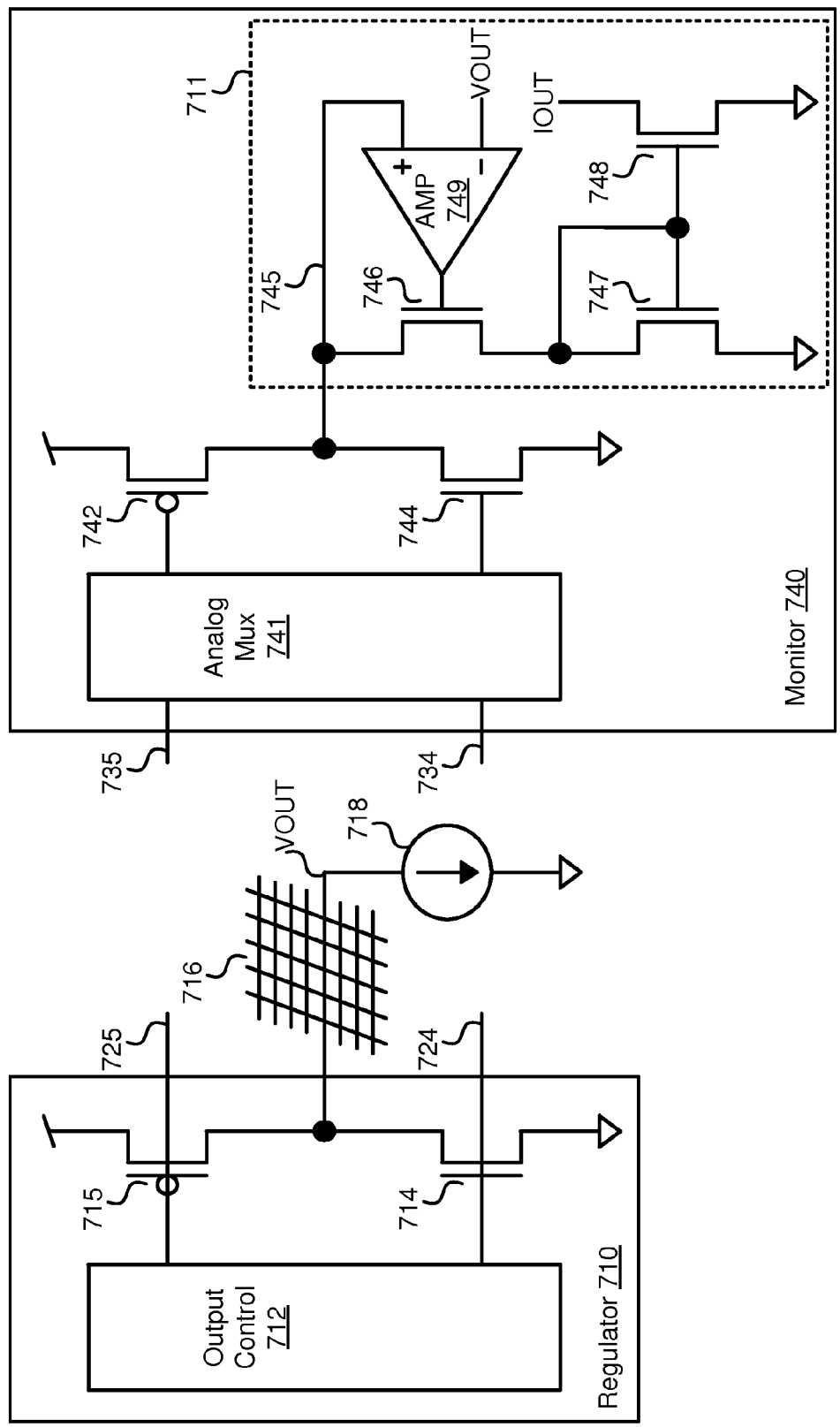
FIG. 8A depicts one embodiment of a current load monitoring system.

FIG. 8A depicts one embodiment of a current load monitoring system. As depicted, the current load monitoring system includes a voltage regulator 710 and a current load monitor 740. The voltage regulator 710 generates an output voltage VOUT that is used to drive a voltage grid 716. VOUT may comprise a voltage reference output used for driving a selected word line, an unselected word line, a selected bit line, or an unselected bit line. In one example, VOUT may comprise a selected bit line voltage that is set to 5V. In another example, VOUT may comprise a voltage reference used to bias unselected word lines that are set to 7V. VOUT may also be set to other voltage levels, for example, between 1V and 10V. As depicted, VOUT drives a current load 718. The current load 718 may comprise memory cell related current loads. In one example, VOUT may comprise an unselected word line voltage reference used to bias unselected memory cells connected to the unselected word line voltage and the current load 718 may comprise reverse leakage current through the unselected memory cells. In some cases, the current load 718 may correspond with a short (or an unintentionally created conducting path) between the voltage grid 716 and another voltage reference (or ground).

Voltage regulator 710 includes an output control circuit 712 for generating voltages 724-725 for driving the last stage of the voltage regulator 710. As depicted, the last stage includes transistors 714-715. Transistor 714 comprises an nMOS transistor and transistor 715 comprises a pMOS transistor. The output control circuit 712 may comprise a class AB output control circuit for generating control voltages for a class AB output stage. The voltages 724-725 generated by the output control circuit 712 may be outputted from the voltage regulator 710 (e.g., to be used by a current load monitoring circuit).

Current load monitor 740 includes an analog multiplexor (mux) 741, an input current mirroring stage formed by transistors 742 and 744, and a current load measuring circuit 711. As depicted, the analog mux 741 includes inputs 734-735 which may comprise one or more pairs of voltages for driving a last stage of an on-chip voltage regulator. In one embodiment, input 735 may be connected to a voltage for controlling a last stage pMOS transistor, such as voltage 725, and input 734 may be connected to a voltage for controlling a last stage nMOS transistor, such as voltage 724. In some embodiments, a memory chip may include ten different voltage regulators for providing ten different voltage references to bias one or more memory arrays and the analog mux 741 may take as inputs ten different pairs of voltages associated with the ten different voltage regulators. The analog mux 741 may select one of the one or more pairs of voltages that are input to the analog mux 741 to drive the input current mirroring stage.

The input current mirroring stage includes transistors 742 and 744, which share a common node 745. Transistor 742 comprises a pMOS transistor and transistor 744 comprises an nMOS transistor. In one embodiment, the input current mirroring stage formed by transistors 742 and 744 generates currents that are substantially similar to those generated by the last stage of a voltage regulator, such as transistors 714-715 of voltage regulator 710. The transistor 742 of the current load monitor 740 and transistor 715 of the voltage regulator 710 form a first current mirror configuration associated with currents provided to the voltage grid 716. The transistor 744 of the current load monitor 740 and transistor 714 of the voltage regulator 710 form a second current mirror configuration associated with currents taken from the voltage grid 716.

The current load measuring circuit 711 includes transistors 746-748 and amplifier 749. Transistors 747-748 comprise nMOS transistors that form a current mirror configuration. Transistor 746 comprises an nMOS transistor that drives the diode connected side of the current mirror configuration formed by transistors 747-748 (i.e., connects to the drain and gate of transistor 747). The gate of transistor 746 is driven by amplifier 749, which takes as inputs the node 745 and the output of a voltage regulator, such as VOUT. In some cases, a mux (not depicted) may take in a plurality of reference voltages associated with a plurality of voltage regulators and select one of the plurality of reference voltages associated with the voltage regulator for which the current load is being measured to be used as the voltage reference input to amplifier 749. For example, if a voltage regulator for generating a selected word line voltage is being monitored, then the output of that voltage regulator will be selected as the voltage reference input to amplifier 749. In one embodiment, amplifier 749 comprises a differential amplifier. Amplifier 749 may also comprise an operational amplifier.

Due to closed-loop feedback, the voltage at node 745 will be regulated close to VOUT. In this case, the drain to source voltages across transistors 714 and 744 may be substantially similar and the drain to source voltages across transistors 715 and 742 may be substantially similar. As the current sourced by transistors 715 and 742 includes the current load to the voltage grid 716, the current through transistor 746 may comprise the current load provided to the voltage grid 716 and the current through transistor 744 may comprise the quiescent current associated with the voltage regulator 710. The current through transistor 746 is mirrored around to provide IOUT via the current mirror configuration formed by transistors 747-748. In some cases, the current load measure circuit 711 may include a comparator (not depicted) for comparing the measured load current IOUT to a threshold current value. The output of the comparator may be used as a flag for determining when the measured load current is greater than the threshold current value.

One benefit of the current load measuring circuit 711 is that the closed-loop feedback through amplifier 749 and transistor 746 isolates node 745 from the current mirror configuration formed by transistors 747-748. Furthermore, regulating node 745 to VOUT causes the current through 746 to be substantially the same as the current load 718 via current summation (i.e., the current through transistor 746 is equal to the current through transistor 742, which comprises the current load 718 plus the quiescent current through transistor 714, minus the current through transistor 744). In some embodiments, if the current through transistor 746 is below a threshold (e.g., below 500 nA), then a stabilization current may be added into the drain of transistor 746 and taken from the source of transistor 746.

Figure 8B:
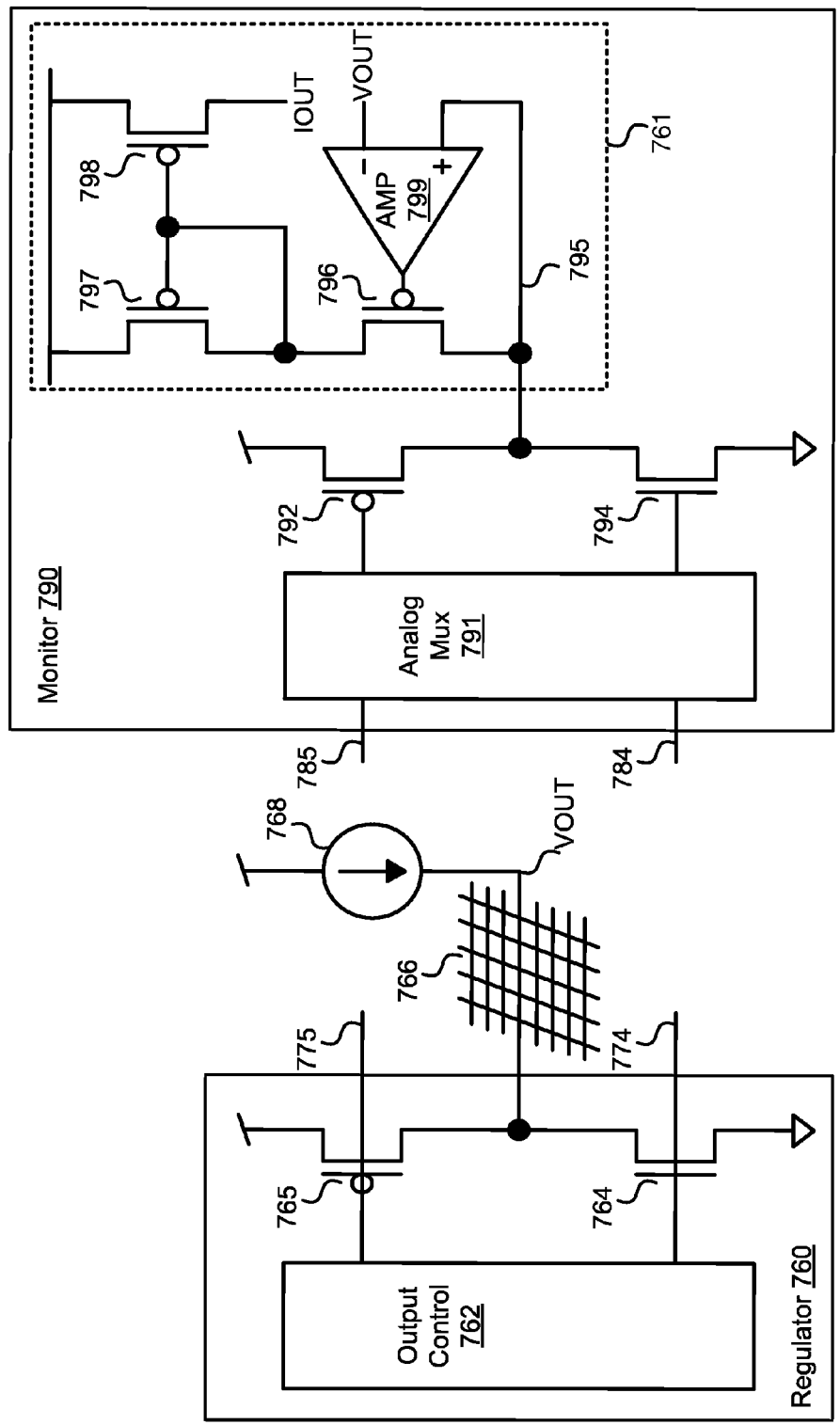
FIG. 8B depicts one embodiment of a current load monitoring system.

FIG. 8B depicts one embodiment of a current load monitoring system. As depicted, the current load monitoring system includes a voltage regulator 760 and a current load monitor 790. The voltage regulator 760 generates an output voltage VOUT that is used to drive a voltage grid 766. VOUT may comprise a voltage reference output used for driving a selected word line, an unselected word line, a selected bit line, or an unselected bit line. In one example, VOUT may comprise a selected bit line voltage that is set to 5V. In another example, VOUT may comprise a voltage reference used to bias an unselected word line that is set to 7V. VOUT may also be set to other voltage levels, for example, between 1V and 10V. As depicted, VOUT sinks a current load 768. The current load 768 may comprise memory cell related current loads. In one example, VOUT may comprise an unselected word line voltage reference used to bias unselected memory cells connected to the unselected word line voltage and the current load 768 may comprise reverse leakage current through the unselected memory cells. In some cases, the current load 768 may correspond with a short (or an unintentionally created conducting path) between the voltage grid 766 and another voltage reference.

Voltage regulator 760 includes an output control circuit 762 for generating voltages 774-775 for driving the last stage of the voltage regulator 760. As depicted, the last stage includes transistors 764-765. Transistor 764 comprises an nMOS transistor and transistor 765 comprises a pMOS transistor. The output control circuit 762 may comprise a class AB output control circuit for generating control voltages for a class AB output stage. The voltages 774-775 generated by the output control circuit 762 may be outputted from the voltage regulator 760 (e.g., to be used by a current load monitoring circuit).

Current load monitor 790 includes an analog multiplexor (mux) 791, an input current mirroring stage formed by transistors 792 and 794, and a current load measuring circuit 761. As depicted, the analog mux 791 includes inputs 784-785 which may comprise one or more pairs of voltages for driving a last stage of an on-chip voltage regulator. In one embodiment, input 785 may be connected to a voltage for controlling a last stage pMOS transistor, such as voltage 775, and input 784 may be connected to a voltage for controlling a last stage nMOS transistor, such as voltage 774. In some embodiments, a memory chip may include ten different voltage regulators for providing ten different voltage references to bias one or more memory arrays and the analog mux 791 may take as inputs ten different pairs of voltages associated with the ten different voltage regulators. The analog mux 791 may select one of the one or more pairs of voltages that are input to the analog mux 791 to drive the input current mirroring stage.

The input current mirroring stage includes transistors 792 and 794, which share a common node 795. Transistor 792 comprises a pMOS transistor and transistor 794 comprises an nMOS transistor. In one embodiment, the input current mirroring stage formed by transistors 792 and 794 generates currents that are substantially similar to those generated by the last stage of a voltage regulator, such as transistors 764-765 of voltage regulator 760. The transistor 792 of the current load monitor 790 and transistor 765 of the voltage regulator 760 form a first current mirror configuration associated with currents provided to the voltage grid 766. The transistor 794 of the current load monitor 790 and transistor 764 of the voltage regulator 760 form a second current mirror configuration associated with currents taken from the voltage grid 766.

The current load measuring circuit 761 includes transistors 796-798 and amplifier 799. Transistors 797-798 comprise pMOS transistors that form a current mirror configuration. Transistor 796 comprises a pMOS transistor that drives the diode connected side of the current mirror configuration formed by transistors 797-798 (i.e., connects to the drain and gate of transistor 797). The gate of transistor 796 is driven by amplifier 799, which takes as inputs the node 795 and the output of a voltage regulator, such as VOUT. In some cases, a mux (not depicted) may take in a plurality of reference voltages associated with a plurality of voltage regulators and select one of the plurality of reference voltages associated with the voltage regulator for which the current load is being measured to be used as the voltage reference input to amplifier 799. For example, if a voltage regulator for generating a selected word line voltage is being monitored, then the output of that voltage regulator will be selected as the voltage reference input to amplifier 799. In one embodiment, amplifier 799 comprises a differential amplifier. Amplifier 799 may also comprise an operational amplifier.

Due to closed-loop feedback, the voltage at node 795 will be regulated close to VOUT. In this case, the drain to source voltages across transistors 764 and 794 may be substantially similar and the drain to source voltages across transistors 765 and 792 may be substantially similar. As the current sunk by transistors 764 and 794 includes the current load taken from the voltage grid 766, the current through transistor 796 may comprise the current load taken from the voltage grid 766 and the current through transistor 792 may comprise the quiescent current associated with the voltage regulator 760. The current through transistor 796 is mirrored around to provide IOUT via the current mirror configuration formed by transistors 797-798. In some cases, the current load measure circuit 761 may include a comparator (not depicted) for comparing the measured load current IOUT to a threshold current value. The output of the comparator may be used as a flag for determining when the measured load current is greater than the threshold current value.

One benefit of the current load measuring circuit 761 is that the closed-loop feedback through amplifier 799 and transistor 796 isolates node 795 from the current mirror configuration formed by transistors 797-798. Furthermore, regulating node 795 to VOUT causes the current through 796 to be substantially the same as the current load 768 via current summation (i.e., the current through transistor 796 is equal to the current through transistor 794, which comprises the current load 768 plus the quiescent current through transistor 765, minus the current through transistor 792). In some embodiments, if the current through transistor 796 is below a threshold (e.g., below 500 nA), then a stabilization current may be added into the source of transistor 796 and taken from the drain of transistor 796.

Figure 8C:
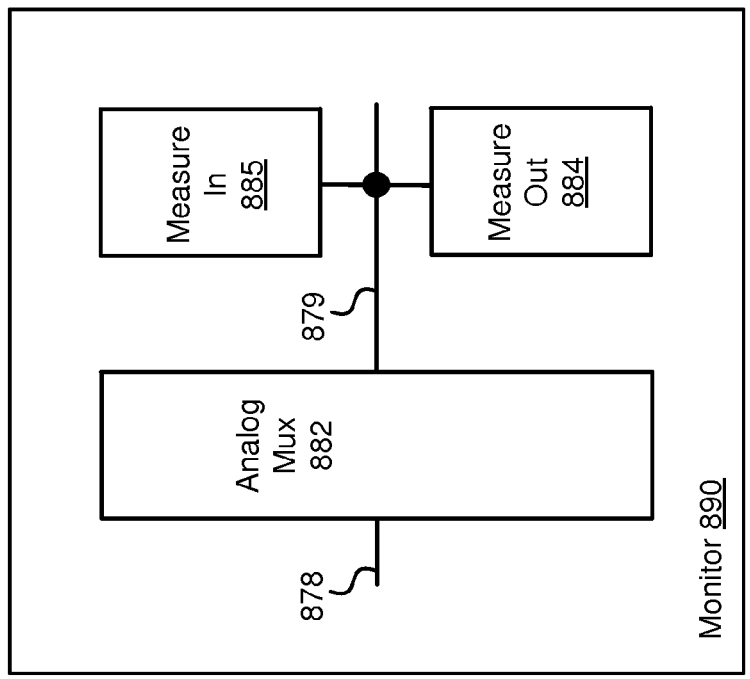
FIG. 8C depicts an alternative embodiment of a current load monitoring system.
Figure 8C:
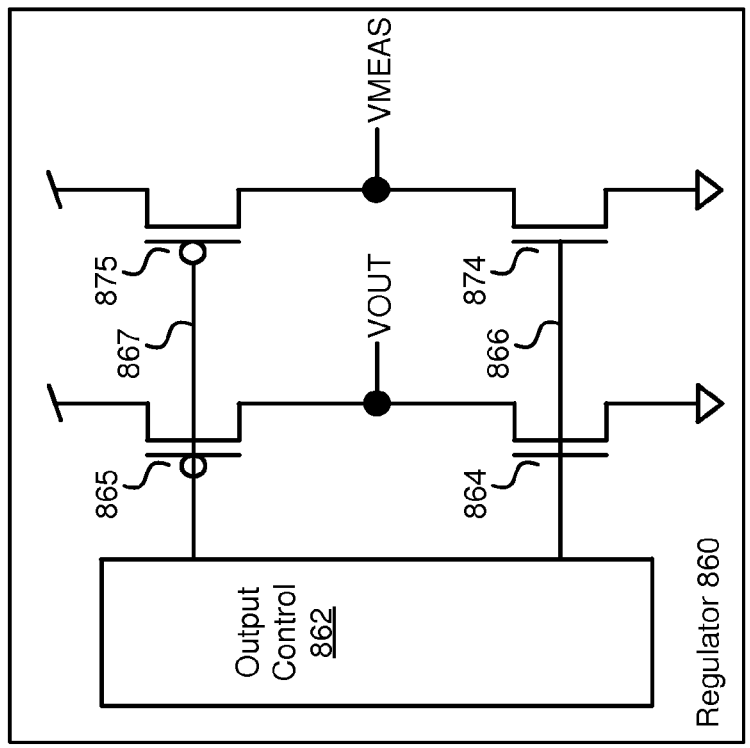

FIG. 8C depicts an alternative embodiment of a current load monitoring system. As depicted, the current load monitoring system includes a voltage regulator 860 and a current load monitor 890. The voltage regulator 860 generates an output voltage VOUT (which may be used to drive a voltage grid, such as voltage grid 716 of FIG. 8A). VOUT may comprise a voltage reference output used for driving a selected word line, an unselected word line, a selected bit line, or an unselected bit line. In one example, VOUT may comprise a selected bit line voltage that is set to 5V. In another example, VOUT may comprise a voltage reference used to bias unselected word lines that are set to 7V. VOUT may also be set to other voltage levels, for example, between 1V and 10V.

Voltage regulator 860 includes an output control circuit 862 for generating voltages 866-867 for driving the last stage of the voltage regulator 860. As depicted, the last stage includes transistors 864-865. Transistor 864 comprises an nMOS transistor and transistor 865 comprises a pMOS transistor. The output control circuit 862 may comprise a class AB output control circuit for generating control voltages for a class AB output stage. The voltages 866-867 generated by the output control circuit 862 are connected to a second output stage formed by transistors 874-875, which share a common node that outputs VMEAS.

Current load monitor 890 includes an analog multiplexor (mux) 882, a first current load measuring circuit (Measure In 885), and a second current load measuring circuit (Measure Out 884). Measure In 885 may measure the current provided to (or input) to a voltage grid and Measure Out 886 may measure the current taken from (or output from) the voltage grid. In one embodiment, Measure In 885 may be implemented using a current load measuring circuit for measuring current loads injected into a voltage grid, such as current load measuring circuit 761 of FIG. 8B. In one embodiment, Measure Out 884 may be implemented using a current load measuring circuit for measuring current loads supplied from a voltage grid, such as current load measuring circuit 711 of FIG. 8A.

As depicted, the analog mux 882 includes input 878 which may comprise one or more voltages associated with second output stages from one or more voltage regulators, such as the second output stage formed by transistors 874-875 of voltage regulator 860. In one embodiment, input 878 may comprise a voltage input associated with VMEAS. In some embodiments, a memory chip may include ten different voltage regulators for providing ten different voltage references to bias one or more memory arrays and the analog mux 882 may take as inputs ten different VMEAS voltages associated with the ten different voltage regulators. The analog mux 882 may select one of the VMEAS voltages input to the analog mux 882 to drive the node 879 which is connected to both current load measuring circuits Measure In 885 and Measure Out 884. In some cases, a mux (not depicted) may select between whether Measure In 885 or Measure Out 884 is connected to node 879 at a particular point in time.

Figure 9A:
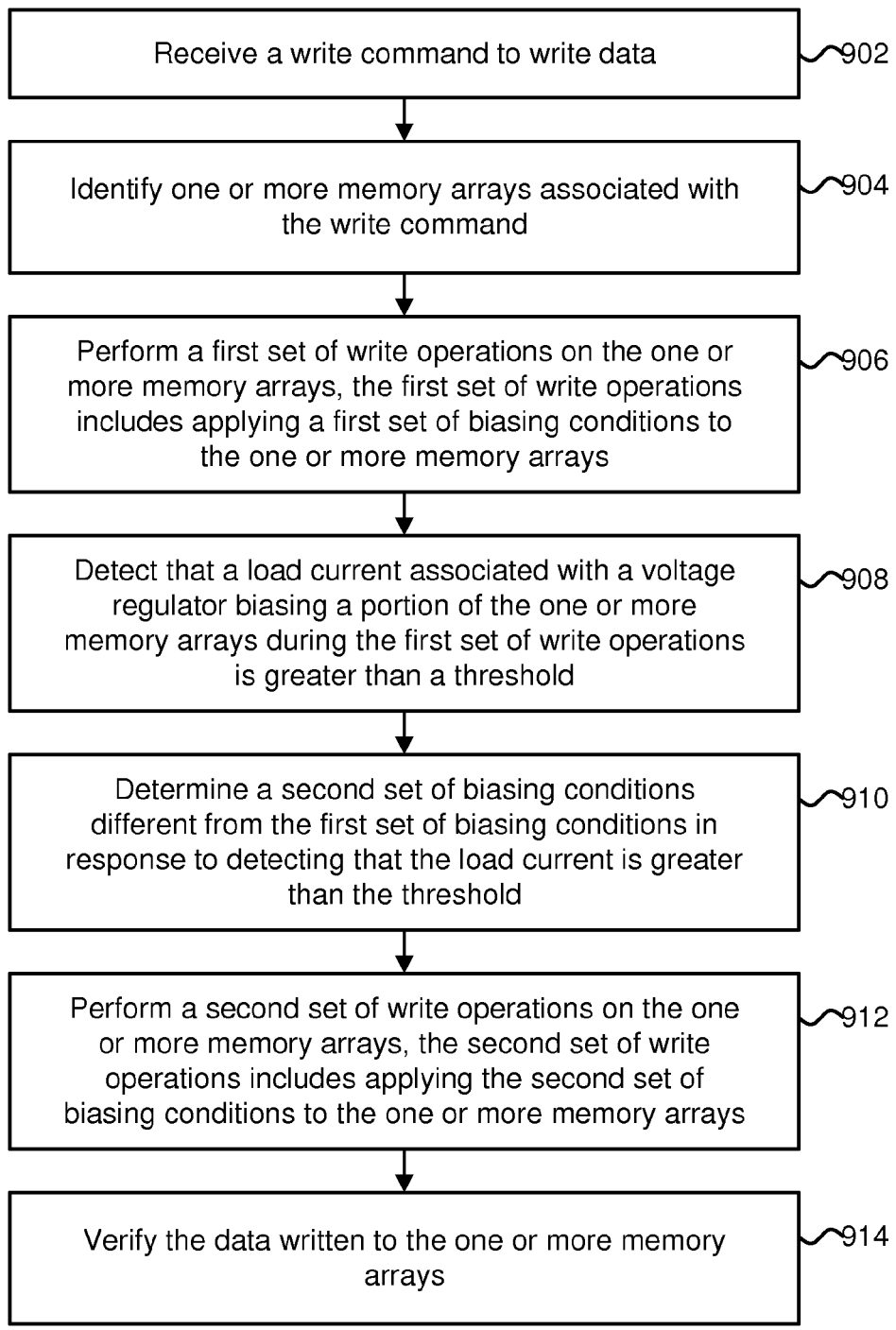
FIG. 9A is a flowchart describing one embodiment of a process for monitoring current loads during a write operation.

FIG. 9A is a flowchart describing one embodiment of a process for monitoring current loads during a write operation. In one embodiment, the process of FIG. 9A is performed by a memory chip, such as memory chip 102 in FIG. 1.

In step 902, a write command to write data is received. The write command may comprise a command to program one or more memory cells. In step 904, one or more memory arrays associated with the write command are identified. In step 906, a first set of write operations is performed on the one or more memory arrays. The first set of write operations may include applying a first set of biasing conditions to the one or more memory arrays. The first set of biasing conditions may include applying a first voltage generated from a first voltage regulator to a selected word line and a second voltage generated from a second voltage regulator to an unselected word line.

In step 908, it is detected that a load current associated with a voltage regulator biasing a portion of the one or more memory arrays during the first set of write operations is greater than a threshold. In one embodiment, the threshold may comprise 10 mA, and if the load current is measured to be greater than 10 mA, then adjustments may be made to biasing conditions applied to the one or more memory arrays.

In step 910, a second set of biasing conditions different from the first set of bias conditions is determined in response to detecting that the load current is greater than the threshold. In step 912, a second set of write operations is performed on the one or more memory arrays. The second set of write operations may include applying the second set of biasing conditions to the one or more memory arrays. In one embodiment, the second set of biasing conditions may include applying a third voltage generated from the first voltage regulator to the selected word line and a fourth voltage generated from the second voltage regulator to the unselected word line. In another embodiment, the second set of biasing conditions may include applying a third voltage generated from a third voltage regulator to the selected word line and a fourth voltage generated from a fourth voltage regulator to the unselected word line. In step 914, the data written to the one or more memory arrays is verified.

In some embodiments, if it is detected that a load current associated with a voltage regulator biasing a portion of one or more memory arrays is greater than a threshold, then the number of memory cells programmed simultaneously during subsequent programming operations may be reduced in order to reduce the load current. The number of memory arrays programmed simultaneously may also be reduced to reduce the load current. In some embodiments, the load currents associated with biasing one or more memory arrays may be determined prior to performing a memory array operation (e.g., prior to a read or write operation).

In some embodiments, the load currents associated with biasing one or more memory arrays may be monitored only when a temperature associated with the one or more memory arrays is greater than a predetermined temperature threshold (e.g., if the temperature of a portion of a memory chip measured using a temperature sensor is greater than 55 degrees Celsius). In some embodiments, a baseline load current may be determined corresponding with a particular temperature (e.g., at a temperature of 65 degrees Celsius, the baseline load current may be 2 mA) and if a temperature associated with one or more memory arrays reaches the particular temperature, then a load current associated with biasing the one or more memory arrays may be compared with the baseline load current. In cases where the load current is greater than the baseline load current, then the number of memory arrays may be reduced during subsequent memory operations (e.g., read or write operations) in order to reduce the load current.

Figure 9B:
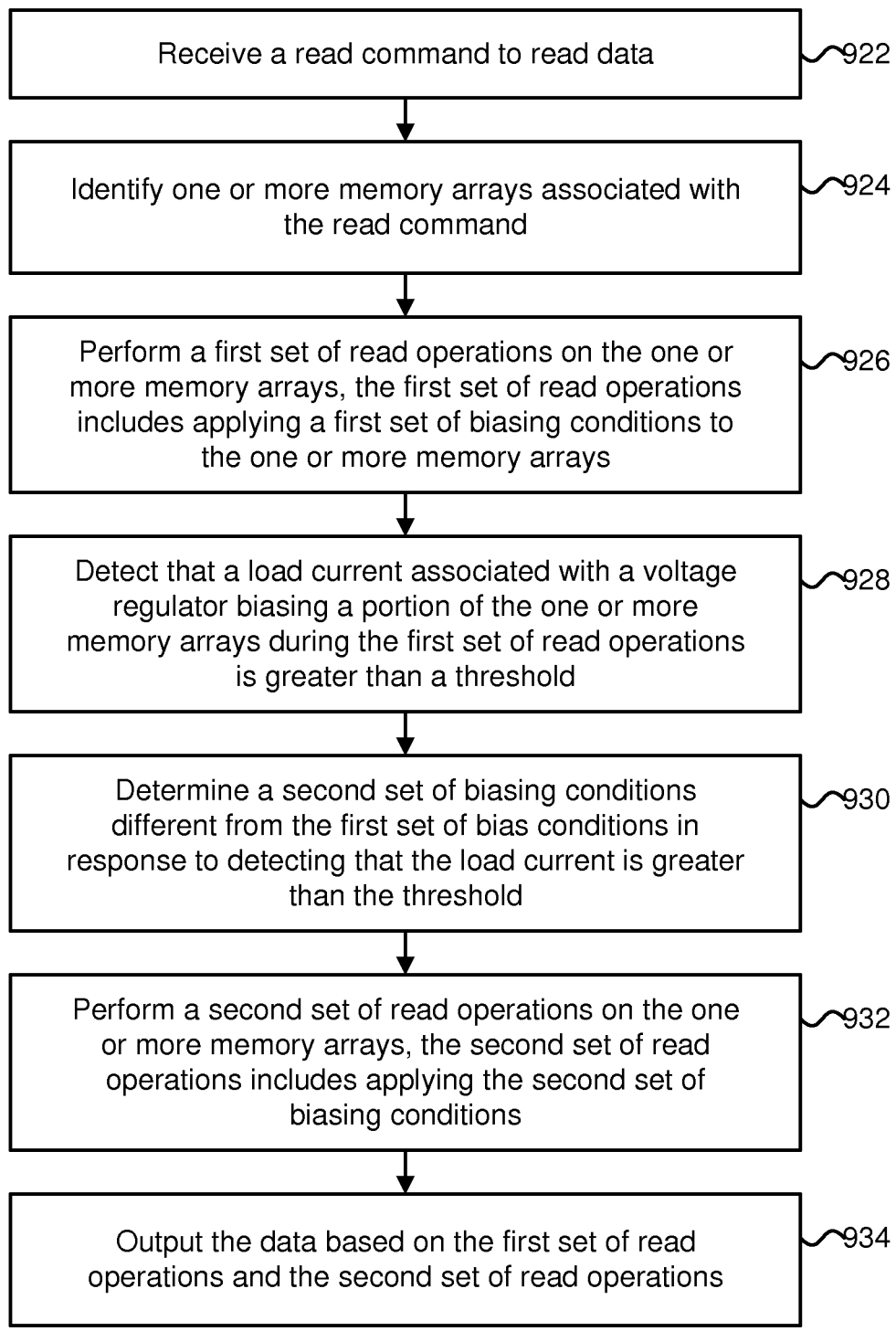
FIG. 9B is a flowchart describing one embodiment of a process for monitoring current loads during a read operation.

FIG. 9B is a flowchart describing one embodiment of a process for monitoring current loads during a read operation. In one embodiment, the process of FIG. 9B is performed by a memory chip, such as memory chip 102 in FIG. 1.

In step 922, a read command to read data is received. The read command may comprise a command to read one or more memory cells. In step 924, one or more memory arrays associated with the read command are identified. In step 926, a first set of read operations is performed on the one or more memory arrays. The first set of read operations may include applying a first set of biasing conditions to the one or more memory arrays. The first set of biasing conditions may include applying a first voltage generated from a first voltage regulator to a selected word line and a second voltage generated from a second voltage regulator to an unselected word line.

In step 928, it is detected that a load current associated with a voltage regulator biasing a portion of the one or more memory arrays during the first set of read operations is greater than a threshold. In one embodiment, the threshold may comprise 1 mA, and if the load current is measured to be greater than 1 mA, then adjustments may be made to biasing conditions applied to the one or more memory arrays.

In step 930, a second set of biasing conditions different from the first set of bias conditions is determined in response to detecting that the load current is greater than the threshold. In step 932, a second set of read operations is performed on the one or more memory arrays. The second set of read operations may include applying the second set of biasing conditions to the one or more memory arrays. In one embodiment, the second set of biasing conditions may include applying a third voltage generated from the first voltage regulator to the selected word line and a fourth voltage generated from the second voltage regulator to the unselected word line. In another embodiment, the second set of biasing conditions may include applying a third voltage generated from a third voltage regulator to the selected word line and a fourth voltage generated from a fourth voltage regulator to the unselected word line. In step 934, the data is outputted based on the first set of read operations and the second set of read operations.

In some embodiments, if it is detected that a load current associated with a voltage regulator biasing a portion of one or more memory arrays is greater than a threshold, then the number of memory arrays read simultaneously during subsequent read operations may be reduced in order to reduce the load current. In some embodiments, the load currents associated with biasing one or more memory arrays may be determined prior to performing particular memory array operations (e.g., prior to a read or write operation).

In some embodiments, the load currents associated with biasing one or more memory arrays may be monitored dynamically only when a temperature associated with the one or more memory arrays is greater than a predetermined temperature threshold (e.g., if the temperature of the chip measured using a temperature sensor is greater than 75 degrees Celsius). In some embodiments, a baseline load current may be determined corresponding with a particular temperature (e.g., at a temperature of 85 degrees Celsius, the baseline load current may be 12 mA) and if a temperature associated with one or more memory arrays reaches the particular temperature, then a load current associated with biasing the one or more memory arrays may be compared with the baseline load current. In cases where the load current is greater than the baseline load current, then the number of memory arrays may be reduced during subsequent memory operations (e.g., read or write operations) in order to reduce the load current.

One embodiment of the disclosed technology includes performing a first set of memory operations on one or more memory arrays. The first set of memory operations includes applying a first set of biasing conditions to the one or more memory arrays. The method further comprises detecting that a load current associated with a voltage regulator biasing at least a portion of the one or more memory arrays during the first set of memory operations is greater than a threshold, determining a second set of biasing conditions different from the first set of biasing conditions in response to detecting that the load current is greater than the threshold, and performing a second set of memory operations on the one or more memory arrays. The second set of memory operations includes applying the second set of biasing conditions.

One embodiment of the disclosed technology includes one or more memory arrays, a first voltage regulator, a current load monitoring circuit, and one or more managing circuits in communication with the first voltage regulator and the current load monitoring circuit. The one or more memory arrays include one or more control lines connected to one or more memory cells. The first voltage regulator generates a first reference voltage. The current load monitoring circuit determines a load current associated with the first voltage regulator. The current load monitoring circuit includes an input current mirroring stage and a current load measuring circuit. The current load measuring circuit regulates a common node of the input current mirroring stage to the first reference voltage. The one or more managing circuits cause a first set of memory operations to be performed on the one or more memory arrays. The first set of memory operations includes applying the first reference voltage to the one or more control lines. The one or more managing circuits detect that the load current associated with the first voltage regulator during the first set of memory operations is greater than a threshold and cause the first voltage regulator to generate a second reference voltage different from the first reference voltage in response to detecting that the load current is greater than the threshold. The one or more managing circuits cause a second set of memory operations to be performed on the one or more memory arrays. The second set of memory operations includes applying the second reference voltage to the one or more control lines.

One embodiment of the disclosed technology includes a first voltage regulator and a current load monitoring circuit. The first voltage regulator generates a first reference voltage and a pair of voltages for driving a class AB output stage of the first voltage regulator. The first reference voltage drives one or more control lines connected to one or more memory cells. The current load monitoring circuit measures a load current associated with the first voltage regulator. The current load monitoring circuit includes an input current mirroring stage and a current load measuring circuit. The input current mirroring stage includes a first transistor and a second transistor sharing a common node. A first voltage of the pair of voltages drives the first transistor and a second voltage of the pair of voltages drives the second transistor. The current load measuring circuit regulates the common node to the first reference voltage and determines whether the load current is greater than a threshold current value by comparing the load current with the threshold current value.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A monolithic three-dimensional integrated circuit, comprising:

a three-dimensional memory array including a first layer of memory cells and a second layer of memory cells, the first layer of memory cells includes a first memory cell, the second layer of memory cells includes a second memory cell, the first memory cell is located above the second memory cell, the second memory cell is located above a substrate, the first memory cell and the second memory cell are formed above the substrate without any intervening substrates between the first memory cell and the second memory cell; and a controller in communication with the three-dimensional memory array, the controller causes a first set of memory operations to be performed on the three-dimensional memory array, a first set of biasing conditions is applied to the three-dimensional memory array during the first set of memory operations, the controller detects that a load current associated with a voltage regulator biasing the three-dimensional memory array during the first set of memory operations is greater than a threshold, the controller determines a second set of biasing conditions different from the first set of biasing conditions in response to detecting that the load current is greater than the threshold, the controller causes a second set of memory operations to be performed on the three-dimensional memory array, the second set of biasing conditions is applied to the three-dimensional memory array during the second set of memory operations.

2. The monolithic three-dimensional integrated circuit of claim 1, wherein:
the first memory cell and the second memory cell are arranged in a vertical column that is perpendicular to the substrate.

3. The monolithic three-dimensional integrated circuit of claim 1, wherein:
the first memory cell and the second memory cell are located within a vertical plane that is perpendicular to the substrate.

4. The monolithic three-dimensional integrated circuit of claim 1, wherein:
the first memory cell and the second memory cell are in communication with a first bit line, the first bit line is arranged in a vertical direction that is perpendicular to the substrate.

5. The monolithic three-dimensional integrated circuit of claim 1, wherein:
the first layer of memory cells includes a third memory cell, the second layer of memory cells includes a fourth memory cell, the third memory cell is located above the fourth memory cell, the first memory cell and the third memory cell are arranged in a first horizontal plane, the second memory cell and the fourth memory cell are arranged in a second horizontal plane that is below the first horizontal plane.

6. The monolithic three-dimensional integrated circuit of claim 1, wherein:
the three-dimensional memory array and the controller are integrated within the monolithic three-dimensional integrated circuit.

7. The monolithic three-dimensional integrated circuit of claim 1, further comprising:
supporting circuitry for the three-dimensional memory array, the supporting circuitry and the controller are integrated within the monolithic three-dimensional integrated circuit, the three-dimensional memory array is fabricated above the supporting circuitry.

8. The monolithic three-dimensional integrated circuit of claim 1, wherein:
the controller detects that a temperature corresponding with the three-dimensional memory array is greater than a temperature threshold, the controller detects that the load current associated with the voltage regulator biasing the three-dimensional memory array during the first set of memory operations is greater than the threshold in response to detecting that the temperature corresponding with the three-dimensional memory array is greater than the temperature threshold.

9. The monolithic three-dimensional integrated circuit of claim 1, wherein:
the first set of memory operations comprises a first set of write operations performed on the three-dimensional memory array, the second set of memory operations comprises a second set of write operations performed on the three-dimensional memory array, the controller adjusts a number of memory cells that are programmed simultaneously within the three-dimensional memory array during the second set of write operations in response to detecting that the load current is greater than the threshold.

10. The monolithic three-dimensional integrated circuit of claim 1, wherein:
the first set of memory operations comprises a first set of read operations, the second set of memory operations comprises a second set of read operations, the controller adjusts a number of memory cells that are read simultaneously from the three-dimensional memory array during the second set of read operations in response to detecting that the load current is greater than the threshold.

11. A monolithic three-dimensional integrated circuit, comprising:
a three-dimensional memory array including a plurality of memory cells, the plurality of memory cells includes a first memory cell and a second memory cell, the first memory cell is formed above the second memory cell, the second memory cell is formed above a substrate, the first memory cell and the second memory cell are arranged in a vertical column that is perpendicular to the substrate, the three-dimensional memory array includes a plurality of control lines connected to the plurality of memory cells;

a voltage regulator, the voltage regulator generates a first reference voltage;

a current load monitoring circuit, the current load monitoring circuit determines a load current associated with the voltage regulator, the current load monitoring circuit includes an input current mirroring stage and a current load measuring circuit, the current load measuring circuit regulates a common node of the input current mirroring stage to the first reference voltage; and one or more managing circuits in communication with the voltage regulator and the current load monitoring circuit, the one or more managing circuits cause a first set of memory operations to be performed on the three-dimensional memory array, the first reference voltage is applied to the plurality of control lines during the first set of memory operations, the one or more managing circuits detect that the load current associated with the voltage regulator during the first set of memory operations is greater than a threshold, the one or more managing circuits cause the voltage regulator to generate a second reference voltage different from the first reference voltage in response to detecting that the load current is greater than the threshold, the one or more managing circuits cause a second set of memory operations to be performed on the three-dimensional memory array, the second reference voltage is applied to the plurality of control lines during the second set of memory operations.

12. The monolithic three-dimensional integrated circuit of claim 11, wherein:
the plurality of control lines comprises a plurality of word lines, the plurality of word lines includes a first word line in communication with the first memory cell and a second word line in communication with the second memory cell.

13. The monolithic three-dimensional integrated circuit of claim 11, wherein:
the first memory cell and the second memory cell are in communication with a first bit line, the first bit line is arranged in a vertical direction that is perpendicular to the substrate.

14. The monolithic three-dimensional integrated circuit of claim 11, wherein:
the three-dimensional memory array includes a third memory cell and a fourth memory cell, the third memory cell is located above the fourth memory cell, the first memory cell and the third memory cell are arranged in a first horizontal plane, the second memory cell and the fourth memory cell are arranged in a second horizontal plane that is located below the first horizontal plane.

15. The monolithic three-dimensional integrated circuit of claim 11, wherein:
the three-dimensional memory array and the one or more managing circuits are formed within the monolithic three-dimensional integrated circuit, the three-dimensional memory array is formed above the one or more managing circuits.

16. The monolithic three-dimensional integrated circuit of claim 11, further comprising:
a temperature sensor, the temperature sensor determines a temperature associated with the three-dimensional memory array, the one or more managing circuits detect that the temperature associated with the three-dimensional memory array is greater than a temperature threshold, the one or more managing circuits determine whether the load current associated with the voltage regulator during the first set of memory operations is greater than a threshold in response to detecting that the temperature associated with the three-dimensional memory array is greater than the temperature threshold.

17. The monolithic three-dimensional integrated circuit of claim 11, wherein:
the first set of memory operations comprises a first set of write operations, the one or more managing circuits adjust a number of memory cells that are programmed simultaneously within the three-dimensional memory array in response to detecting that the load current is greater than the threshold.

18. The monolithic three-dimensional integrated circuit of claim 11, wherein:
the first set of memory operations comprises a first set of read operations, the one or more managing circuits adjust a number of memory cells that are read simultaneously from the three-dimensional memory array in response to detecting that the load current is greater than the threshold.

19. A monolithic three-dimensional integrated circuit, comprising:
a three-dimensional memory array including a first string of memory cells, the first string of memory cells includes a first memory cell and a second memory cell arranged in a vertical column that is perpendicular to a substrate, the first memory cell and the second memory cell are formed above the substrate without any intervening substrates between the first memory cell and the second memory cell; and
supporting circuitry in communication with the three-dimensional memory array, the supporting circuitry causes a first set of memory operations to be performed on the three-dimensional memory array, the first set of biasing conditions is applied to the three-dimensional memory array during the first set of memory operations, the supporting circuitry detects that a load current associated with a voltage regulator biasing the three-dimensional memory array during the first set of memory operations is greater than a threshold, the supporting circuitry determines a second set of biasing conditions different from the first set of biasing conditions in response to detecting that the load current is greater than the threshold, the supporting circuitry causes a second set of memory operations to be performed on the three-dimensional memory array, the second set of biasing conditions is applied to the three-dimensional memory array during the second set of memory operations.

20. The monolithic three-dimensional integrated circuit of claim 19, wherein:
the first memory cell and the second memory cell are in communication with a first bit line, the first bit line is arranged in a vertical direction that is perpendicular to the substrate.

21. The monolithic three-dimensional integrated circuit of claim 19, wherein:
the three-dimensional memory array includes a second string of memory cells, the second string of memory cells includes a third memory cell and a fourth memory cell, the first memory cell is formed above the second memory cell, the second memory cell is formed above the substrate, the third memory cell is located above the fourth memory cell, the first memory cell and the third memory cell are arranged in a first horizontal plane, the second memory cell and the fourth memory cell are arranged in a second horizontal plane that is below the first horizontal plane.

22. The monolithic three-dimensional integrated circuit of claim 19, wherein:
the three-dimensional memory array and the supporting circuitry are formed within the monolithic three-dimensional integrated circuit, the three-dimensional memory array is formed above the supporting circuitry.

23. A method for operating a monolithic three-dimensional integrated circuit, comprising:
performing a first set of memory operations on a three-dimensional memory array, the three-dimensional memory array includes a first layer of memory cells and a second layer of memory cells, the first layer of memory cells includes a first memory cell, the second layer of memory cells includes a second memory cell, the first memory cell is located above the second memory cell, the second memory cell is located above a substrate, the first memory cell and the second memory cell are arranged in a vertical column that is perpendicular to the substrate, the first set of memory operations includes applying a first voltage to a first control line connected to the first memory cell;
detecting that a load current associated with a voltage regulator generating the first voltage during the first set of memory operations is greater than a threshold;
generating a second voltage different from the first voltage in response to the detecting; and performing a second set of memory operations on the three-dimensional memory array, the second set of memory operations includes applying the second voltage to the first control line connected to the first memory cell.

24. The method of claim 23, wherein:

the first set of memory operations comprises a first set of write operations, the second set of memory operations comprises a second set of write operations, the first control line comprises a first word line, the voltage regulator generates the second voltage during the second set of memory operations.

25. The method of claim 23, wherein:

the first memory cell and the second memory cell are in communication with a first bit line, the first bit line is arranged in a vertical direction that is perpendicular to the substrate.

26. A monolithic three-dimensional integrated circuit, comprising:

a non-volatile memory, the non-volatile memory is monolithically formed in one or more physical levels of memory cells having active areas disposed above a substrate; and a controller in communication with the non-volatile memory, the controller causes a first set of memory operations to be performed on the non-volatile memory, a first set of biasing conditions is applied to the non-volatile memory during the first set of memory operations, the controller detects that a load current associated with a voltage regulator biasing the non-volatile memory during the first set of memory operations is greater than a threshold, the controller determines a second set of biasing conditions different from the first set of biasing conditions in response to detecting that the load current is greater than the threshold, the controller causes a second set of memory operations to be performed on the non-volatile memory, the second set of biasing conditions is applied to the non-volatile memory during the second set of memory operations.

27. A monolithic three-dimensional integrated circuit, comprising:

a non-volatile memory, the non-volatile memory is monolithically formed in one or more physical levels of memory cells having active areas disposed above a substrate; and a voltage regulator, the voltage regulator generates a first reference voltage;

a current load monitoring circuit, the current load monitoring circuit determines a load current associated with the voltage regulator, the current load monitoring circuit includes an input current mirroring stage and a current load measuring circuit, the current load measuring circuit regulates a common node of the input current mirroring stage to the first reference voltage; and one or more managing circuits in communication with the voltage regulator and the current load monitoring circuit, the one or more managing circuits cause a first set of memory operations to be performed on the non-volatile memory, the first reference voltage is applied to the plurality of control lines during the first set of memory operations, the one or more managing circuits detect that the load current associated with the voltage regulator during the first set of memory operations is greater than a threshold, the one or more managing circuits cause the voltage regulator to generate a second reference voltage different from the first reference voltage in response to detecting that the load current is greater than the threshold, the one or more managing circuits cause a second set of memory operations to be performed on the non-volatile memory, the second reference voltage is applied to the plurality of control lines during the second set of memory operations.

28. A method for operating a monolithic three-dimensional integrated circuit, comprising:

performing a first set of memory operations on a non-volatile memory, the non-volatile memory includes a first memory cell, the non-volatile memory is monolithically formed in one or more physical levels of memory cells having active areas disposed above a substrate, the first set of memory operations includes applying a first voltage to a first control line connected to the first memory cell;

detecting that a load current associated with a voltage regulator generating the first voltage during the first set of memory operations is greater than a threshold;

generating a second voltage different from the first voltage in response to the detecting; and performing a second set of memory operations on the non-volatile memory, the second set of memory operations includes applying the second voltage to the first control line connected to the first memory cell.

* * * * *